(12) United States Patent
Yan

(10) Patent No.: US 12,432,920 B2
(45) Date of Patent: Sep. 30, 2025

(54) THREE-DIMENSIONAL NAND MEMORY DEVICE AND METHOD OF FORMING THE SAME

(71) Applicant: Yangtze Memory Technologies Co., Ltd., Hubei (CN)

(72) Inventor: Bingjie Yan, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 574 days.

(21) Appl. No.: 17/872,484

(22) Filed: Jul. 25, 2022

(65) Prior Publication Data

US 2023/0217657 A1 Jul. 6, 2023

Related U.S. Application Data

(63) Continuation of application No. PCT/CN2021/142994, filed on Dec. 30, 2021.

(51) Int. Cl.
*H10B 43/27* (2023.01)
*H10B 41/27* (2023.01)

(52) U.S. Cl.
CPC .......... *H10B 43/27* (2023.02); *H10B 41/27* (2023.02)

(58) Field of Classification Search
CPC ........ H10B 41/27; H10B 43/27; H10B 43/35; H10B 43/10; H10B 43/30; H10B 41/10; H10B 43/40; H10B 43/50; H10B 41/44; H10B 41/20; H10B 43/20; H10B 41/35; H01L 21/32139; H01L 21/31144; H01L 21/02164; H01L 21/32133; H01L 21/02178; H01L 21/31111; H01L 21/02636; H01L 21/0217; H01L 23/535; H01L 21/76895; H01L 21/7684;
(Continued)

(56) References Cited

U.S. PATENT DOCUMENTS

2017/0077131 A1* 3/2017 Konagai .......... H01L 21/76879
2018/0130814 A1* 5/2018 Lee .................. H10B 43/27
(Continued)

FOREIGN PATENT DOCUMENTS

CN 105374826 A 3/2016
CN 112997309 A 6/2021

OTHER PUBLICATIONS

International Search Report issued on Aug. 25, 2022 in PCT/CN2021/142994, 4 pages.
(Continued)

*Primary Examiner* — Mouloucoulaye Inoussa
(74) *Attorney, Agent, or Firm* — Oblon, McClelland, Maier & Neustadt, L.L.P.

(57) ABSTRACT

According to an aspect of the disclosure, a semiconductor device is provided. The semiconductor device includes one or more bottom select gate (BSG) layers positioned over a substrate, a plurality of word line layers positioned over the one or more BSG layers, and a plurality of insulating layers positioned on the substrate. The plurality of insulating layers is disposed on surfaces of the substrate, the one or more BSG layers, and the plurality of word line layers. The semiconductor device includes a first dielectric structure extending from the substrate and through the one or more BSG layers, and a second dielectric structure extending from the first dielectric structure and through the plurality of word line layers.

20 Claims, 17 Drawing Sheets

(58) Field of Classification Search
CPC ......... H01L 21/76805; H01L 21/76831; H01L 2221/1063; H10D 64/035; H10D 64/037; H10D 30/696; H10D 62/40; H10D 30/693; H10D 30/60; G11C 8/14
See application file for complete search history.

(56) References Cited

U.S. PATENT DOCUMENTS

| | | | | |
|---|---|---|---|---|
| 2019/0043889 | A1* | 2/2019 | Park | H10B 43/10 |
| 2019/0067324 | A1* | 2/2019 | Zhang | H01L 21/77 |
| 2019/0296117 | A1* | 9/2019 | Ishiduki | H10D 30/693 |
| 2020/0185408 | A1* | 6/2020 | Song | H10B 43/27 |
| 2020/0212061 | A1 | 7/2020 | Choi et al. | |
| 2020/0273872 | A1* | 8/2020 | Hua | H10B 43/27 |
| 2020/0273873 | A1* | 8/2020 | Hua | H01L 23/535 |
| 2020/0388629 | A1* | 12/2020 | Lee | H01L 23/10 |
| 2020/0403074 | A1* | 12/2020 | Ishiduki | H10B 43/50 |
| 2021/0043647 | A1* | 2/2021 | Kim | H10B 43/40 |
| 2021/0057439 | A1* | 2/2021 | Tessariol | H01L 23/5283 |
| 2021/0111079 | A1* | 4/2021 | Shi | H10B 41/50 |
| 2021/0118899 | A1* | 4/2021 | King | H10B 43/10 |
| 2021/0225863 | A1* | 7/2021 | Wu | H01L 21/76831 |
| 2021/0225872 | A1* | 7/2021 | Sun | H10B 43/50 |
| 2021/0257386 | A1* | 8/2021 | Wang | H10B 41/10 |
| 2021/0296336 | A1* | 9/2021 | Xue | H10B 41/35 |
| 2021/0296345 | A1* | 9/2021 | Wang | H10B 43/50 |
| 2021/0327510 | A1* | 10/2021 | Song | H01L 23/5283 |
| 2021/0335807 | A1* | 10/2021 | Wu | H10B 43/27 |
| 2022/0059563 | A1* | 2/2022 | Adachi | H10B 43/10 |
| 2022/0077181 | A1 | 3/2022 | Guo et al. | |
| 2022/0115392 | A1* | 4/2022 | Zhang | H10B 41/20 |
| 2022/0344365 | A1* | 10/2022 | Fujimura | H10B 43/27 |
| 2023/0069778 | A1* | 3/2023 | Zhang | H10B 43/10 |
| 2023/0389305 | A1* | 11/2023 | Choi | H10B 43/10 |

OTHER PUBLICATIONS

Extended European Search Report (EESR) in European Patent Application No. 21969552.5, along with the European search opinion, dated Jun. 6, 2025, citing document Nos. 1, 2 and 15, 15 pages.

* cited by examiner

THREE-DIMENSIONAL NAND MEMORY DEVICE AND METHOD OF FORMING THE SAME

CROSS-REFERENCE TO RELATED APPLICATIONS

This application is a continuation of International Application No. PCT/CN2021/142994, filed on Dec. 30, 2021, entitled "THREE-DIMENSIONAL NAND MEMORY DEVICE AND METHOD OF FORMING THE SAME," which is hereby incorporated by reference in its entirety.

BACKGROUND

As critical dimensions of devices in integrated circuits shrink to the limits of common memory cell technologies, designers have been looking to techniques for stacking multiple planes of memory cells to achieve greater storage capacity, and to achieve lower costs per bit. A 3D NAND memory device is an exemplary device of stacking multiple planes of memory cells to achieve greater storage capacity, and to achieve lower costs per bit. The 3D NAND memory device can include a stack of alternating insulating layers and word line layers over a substrate, where one or more lowermost word line layers in the stack can function as bottom select gate (BSG) layers. A plurality of dummy channel structures can extend from the substrate and through the insulating layers and the word line layers to sustain the stack. In addition, a plurality of BSG cut structures can be formed to separate the BSG layers into sub-BSG layers.

SUMMARY

The present disclosure describes embodiments generally related to a dummy channel structure of a 3D NAND memory device that includes a bottom portion positioned in the BSG layers and a top portion extending from the bottom portion. The bottom portion of the dummy channel structure includes a stop layer to improve a process window of the formation of the dummy channel structure.

According to an aspect of the disclosure, a semiconductor device is provided. The semiconductor device can include one or more bottom select gate (BSG) layers positioned over a substrate, a plurality of word line layers positioned over the one or more BSG layers, and a plurality of insulating layers positioned on the substrate. The plurality of insulating layers can be disposed on surfaces of the substrate, the one or more BSG layers, and the plurality of word line layers. The semiconductor device can include a first dielectric structure extending from the substrate and through the one or more BSG layers, and a second dielectric structure extending from the first dielectric structure and through the plurality of word line layers.

In some embodiments, the first dielectric structure further can include a spacer formed over sidewalls and a bottom of the first dielectric structure, and a filler positioned in and in contact with the spacer.

In the semiconductor device, a critical dimension (CD) of a top surface of the filler of the first dielectric structure can be larger than a CD of a bottom surface of the second dielectric structure. A CD of a bottom surface of the first dielectric structure can be larger than the CD of the bottom surface of the second dielectric structure.

In some embodiments, the filler can include one of a polysilicon and a dielectric material. The filler can be configured to be an etch stop layer to prevent the second dielectric structure from extending through the first dielectric structure. Accordingly, the second dielectric structure can extend from the filler and a bottom portion of the second dielectric structure further can be in contact with the spacer.

In some embodiments, a cross-section of the first dielectric structure obtained along a direction parallel to the substrate can include one of a circular shape and an oval shape. A cross-section of the second dielectric structure obtained along the direction parallel to the substrate can also include one of a circular shape and an oval shape.

The semiconductor device can include a first slit structure extending through the one or more BSG layers and the plurality of word line layers and further into the substrate. The first slit structure can further extend along a horizontal direction parallel to the substrate. The semiconductor device can include a second slit structure extending through the one or more BSG layers and the plurality of word line layers and further into the substrate. The second slit structure can be positioned along a same line as the first slit structure in the horizontal direction. The semiconductor device can also include a separation structure extending through the one or more BSG layers and further into the substrate, where the separation structure can further be positioned between the first and second slit structures and extend in the horizontal direction.

In some embodiments, the separation structure can include a dielectric layer that is formed together with the spacer of the first dielectric structure based on a deposition process.

In some embodiments, the first dielectric structure can further be positioned adjacent to and in contact with the separation structure.

In some embodiments, the separation structure can further include a dielectric layer formed along sidewalls and a bottom of the separation structure and a polysilicon layer positioned in and in contact with the dielectric layer.

In some embodiments, the dielectric layer of the separation structure and the spacer of the first dielectric structure can be formed based on a first deposition process, and the polysilicon layer of the separation structure and the filler of the first dielectric structure can be formed based on a second deposition process.

The semiconductor device can include a dummy channel structure that includes the first dielectric structure and the second dielectric structure. The semiconductor device can also include a three-dimensional NAND flash memory device.

According to another aspect of the disclosure, a method of manufacturing a semiconductor device is provided. In the method, one or more BSG layers can be formed over a substrate and a plurality of first insulating layers can be formed on surfaces of the substrate and the one or more sacrificial BSG layers. A first opening can be formed, through a first etching process, to extend through the one or more sacrificial BSG layers and the plurality of first insulating layers and further into the substrate. The first opening can include sidewalls and a bottom extending into the substrate. A first dielectric structure can subsequently be formed in the first opening. A plurality of sacrificial word line layers and a plurality of second insulating layers can be formed so as to be alternatingly stacked over the one or more sacrificial BSG layers. A second dielectric structure can be formed to extend from the first dielectric structure and through the plurality of sacrificial word line layers and the plurality of second insulating layers.

In order to form the first dielectric structure in the first opening, a dielectric material can be conformally deposited through a first deposition process to form a spacer along the sidewalls and over the bottom of the first opening. A polysilicon can further be deposited over the spacer in the first opening through a second deposition process to form a filler.

In some embodiments, a critical dimension (CD) of a top surface of the filler of the first dielectric structure can be larger than a CD of a bottom surface of the second dielectric structure, and a CD of a bottom surface of the first dielectric structure can be larger than the CD of the bottom surface of the second dielectric structure.

To form the second dielectric structure, a second opening can be formed to extend through the plurality of sacrificial word line layers and the plurality of second insulating layers and further into the filler. The filler can be removed to form a third opening, where the third opening can include a bottom portion in contact with the spacer and a top portion in contact with the plurality of sacrificial word line layers and the plurality of second insulating layers. The third opening can be filled to form the second dielectric structure in the top portion of the third opening.

In the method, a trench opening can be formed through the first etching process. The trench opening can be formed to extend through the one or more sacrificial BSG layers and further extend in a horizontal direction parallel to the substrate. The trench opening can include sidewalls and a bottom extending into the substrate. The dielectric material can be conformally deposited through the first deposition process to form a dielectric layer along the sidewalls and over the bottom of the trench opening. The polysilicon can be deposited over the dielectric layer in the trench opening through the second deposition process to form a separation structure.

In order to form the second dielectric structure, a second etching process can be performed to form a second opening. The second opening can extend through the plurality of sacrificial word line layers and the plurality of second insulating layers to expose the filler. The second etching process can further remove a portion of the filler. The second opening can be filled with a dielectric material to form the second dielectric structure such that the second dielectric structure extends from the filler and a bottom portion of the second dielectric structure is in contact with the spacer.

In some embodiments, the filler can be configured to be an etch stop layer to prevent the second etching process from extending through the first dielectric structure.

In the method, a trench opening can be formed through the first etching process. The trench opening can extend through the one or more sacrificial BSG layers and the plurality of first insulating layers and into the substrate. The trench opening can be filled with the dielectric material through the first deposition process to form a separation structure.

In the method, a first slit structure can be formed to extend through the one or more sacrificial BSG layers and the sacrificial word line layers and into the substrate. The first slit structure can further extend along the horizontal direction. A second slit structure can be formed to extend through the one or more sacrificial BSG layers and the sacrificial word line layers and into the substrate, where the second slit structure can be positioned along a same line as the first slit structure in the horizontal direction. Accordingly, the separation structure can extend through the one or more sacrificial BSG layers and the plurality of first insulating layers. The separation structure can be positioned between the first and second slit structures, and further extend in the horizontal direction.

In some embodiments, the one or more sacrificial BSG layers and the plurality of sacrificial word line layers can be replaced with a conductive material to form one or more BSG layers and a plurality of word line layers.

According to yet another aspect of the disclosure, a memory system device is provided. The memory system device can include control circuitry coupled with a memory device. The memory device can include one or more bottom select gate (BSG) layers positioned over a substrate, and a plurality of word line layers positioned over the one or more BSG layers. The memory device can include a plurality of insulating layers positioned over the substrate, and disposed on surfaces of the substrate, the one or more BSG layers, and the plurality of word line layers. The memory device can include a first dielectric structure extending from the substrate and through the one or more BSG layers, and a second dielectric structure extending from the first dielectric structure and through the plurality of word line layers.

BRIEF DESCRIPTION OF THE DRAWINGS

Aspects of the present disclosure can be understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1:
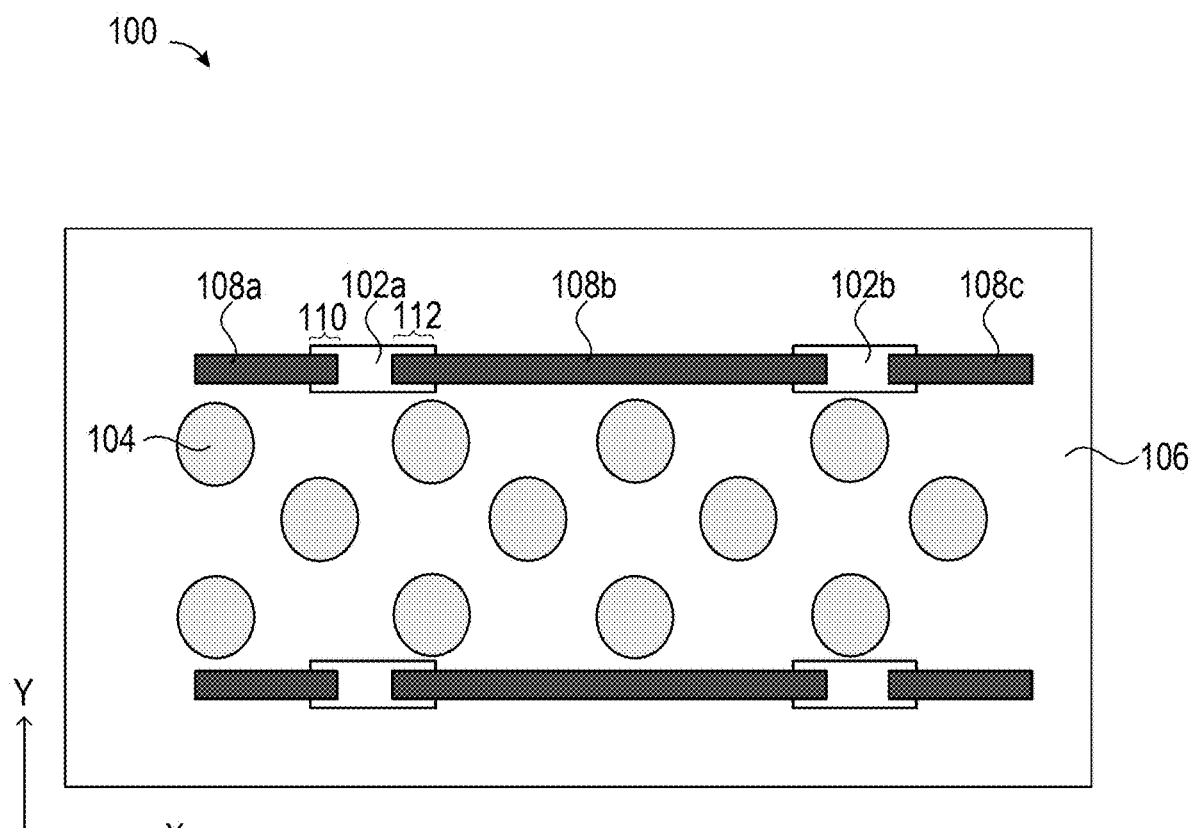
FIG. 1 is a top down view of a 3D NAND memory device in a related example, in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a related 3D NAND memory device, a stack of alternating insulating layers and word line layers can be formed over a substrate, where one or more lowermost word line layers in the stack can function as bottom select gate (BSG) layers. In addition, a plurality of BSG cut structures can be formed to separate the BSG layers into sub-BSG layers. The stack can include an array region and staircase regions. A plurality of channel structures can extend from the substrate and through the insulating layers and the word line layers in the array region to form a plurality of memory cell strings. A plurality of dummy channel structures can extend from the substrate and through the insulating layers and the word line layers in the staircase regions. The dummy channel structures can further extend into the substrate and serve as sustain components to support the staircase and/or the array region when sacrificial layers are removed to form the word line layers.

In order to form the dummy channel structures, an etching process can be performed to form dummy channel openings that extend through the insulating layers and the word line layers in the staircase regions and further into the substrate. However, as 3D NAND memory devices migrate to higher storage densities and more and more word line layers are incorporated in the 3D NAND memory device, under etch at the bottom of the dummy channel openings can occur. In addition, recess depths (or gouging) of the dummy channel openings into the substrate may not be uniform. Further, bottom portions of the dummy channel structures can be deformed due to small bottom critical dimensions (CDs).

In the disclosure, the dummy channel structure can be formed by a plurality of portions. The plurality of different portions can include a bottom portion positioned in the BSG layers and a top portion extending from the bottom portion. In an embodiment, the bottom portion of the dummy channel structure can be formed together with the BSG cut structures. For example, the formation of the bottom portion of the dummy channel structure and the BST cut structures can share a photolithography process, an etching process, a deposition process, the like, or a combination thereof to save process time and cost. In another embodiment, the bottom portion of the dummy channel structure and the BSG cut structure can be made using different processes. The bottom portion can have a larger CD compared to a CD of the dummy channel structure in the related example. The larger CD can prevent the under etch, and improve the bottom profile of the dummy channel structure, which can in turn improve the sustaining strength of the dummy channel structure and improve the uniformity of the gouging. The bottom portion can also include a stop layer (e.g., a polysilicon layer) to improve a process window of the formation of the dummy channel structure.

FIG. 1 shows a top down view of a 3D NAND memory device (or device) 100 in a related example. The device 100 can include one or more BSG layers positioned over a substrate, a plurality of word line layers positioned over the one or more BSG layers, and a plurality of insulating layers disposed alternatingly between the one or more BSG layers and the plurality of word line layers. For example, an uppermost insulating layer 106 of the plurality of insulating layers can be provided in FIG. 1. The device 100 can include a plurality of dummy channel structures 104 that extend from the substrate and further through the one or more BSG layers, the plurality of word line layers, and the plurality of insulating layers. The device 100 can also include a plurality of slit structures (e.g., 108a-108c) that can extend from the substrate and further through the one or more BSG layers, the plurality of word line layers, and the plurality of insulating layers. The slit structures can further extend along a horizontal direction (e.g., X direction) parallel to the substrate. A plurality of BSG cut structures (e.g., in regions 102a-102b) can be formed to extend from the substrate and further through the one or more BSG layers to divide the one or more BSG layers into a plurality of sub-BSG layers. Each of the sub-BSG layers can receive a respective operation voltage through word line contacts (not shown) that are coupled to the sub-BSG layers.

In some embodiments, a gate-last fabrication technology is used to form the device 100. The slit structures are formed to assist in the removal of sacrificial word line layers, and the formation of the real gates (or word line layers). In some embodiments, the slit structures can be made of conductive materials and positioned on array common source (ACS) regions (not shown) to serve as contacts, where the ACS regions are formed in the substrate to serve as common sources. In some embodiments, the slit structures can be made of dielectric materials to serve as separation structures.

Still referring to FIG. 1, each of the plurality of BSG cut structures (e.g., in regions 102a-102b) can be arranged between two respective slit structures of the plurality of the slit structures. For example, the BSG cut structure 102a can be positioned between the slit structures 108a and 108b. In some embodiments, end portions of the slit structures can further extend into the BSG cut structures to form overlapped regions. For example, an end portion of the slit structure 108a and an end portion of the slit structure 108b can extend into the BSG cut structure 102a to form overlapped regions 110 and 112, respectively. In the device 100, in order to form the dummy channel structures 104, a plurality of dummy channel openings can be formed to extend through the one or more BSG layers, the insulating layers, and the word line layers and further into the substrate. As 3D NAND memory devices migrate to higher storage densities and more and more word line layers are incorporated in the device 100, under etch at the bottom of the dummy channel openings can occur. In addition, recess depths (or gouging) of the dummy channel openings into the substrate may not be uniform. Further, bottom portions of the dummy channel structures can be deformed due to small bottom CDs.

Figure 2A:
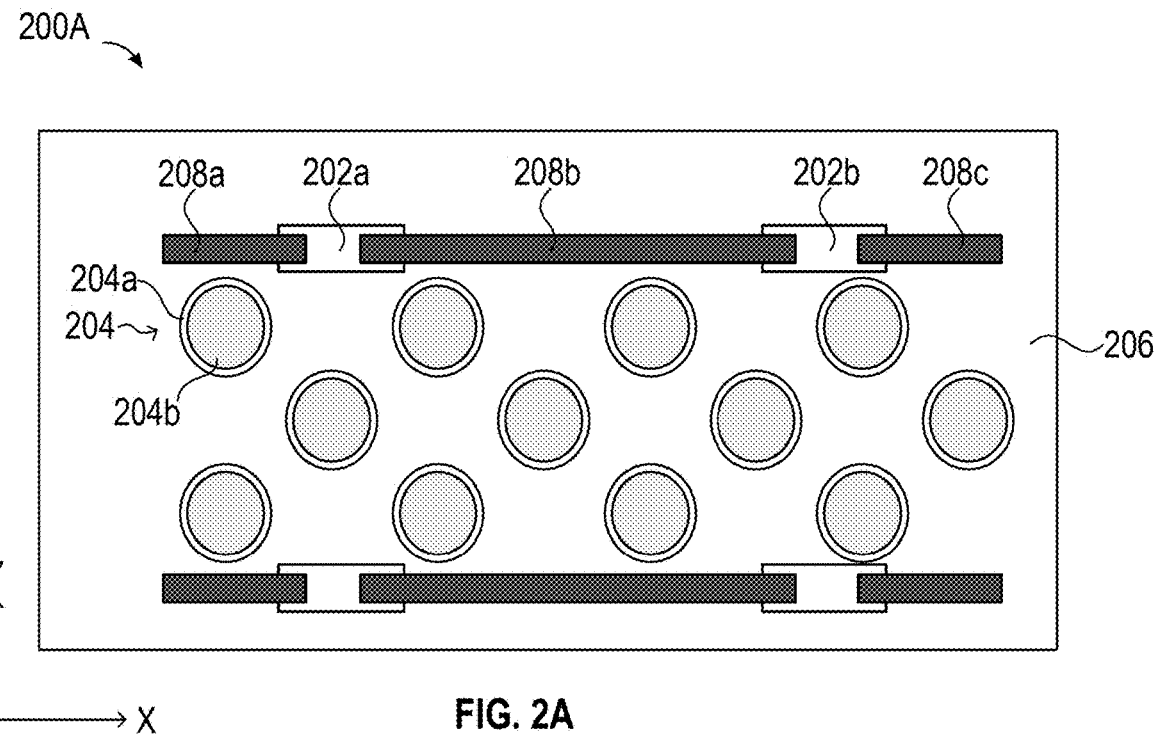
FIG. 2A is a top down view of a first 3D NAND memory device in accordance with exemplary embodiments of the disclosure.

FIG. 2A is a top down view of a 3D NAND memory device (or device) 200A according to an embodiment of the disclosure. As shown in FIG. 2A, the device 200A can have similar configurations to the device 100. For example, the device 200A can have a plurality of slit structures (e.g., 208a-208c) extending through one or more BSG layers, a plurality of word line layers, and a plurality of insulating layers (e.g., insulating layer 206). The plurality of slit structures can further extend along a direction (e.g., X direction) parallel to the substrate. The device 200A can include a plurality of BSG cut structures (e.g., in regions 202a-202b) that are positioned between slit structures. The device 200A can also include a plurality of dummy channel structures 204 that extend from the substrate and further through the one or more BSG layers, the plurality of word line layers, and the plurality of insulating layers. However, compared to the dummy channel structures 104 in FIG. 1, each of the dummy channel structures 204 in FIG. 2A can include a plurality portions, such as a bottom portion 204a and a top portion 204b. Additional portions can be provided in other embodiments. The bottom portion 204a can be formed with the BSG cut structures. The bottom portion 204a can extend from the substrate and through the one or more BSG layers. The top portion 204b can extend from the bottom portion 204a and further through the plurality of word lines.

Figure 2B:
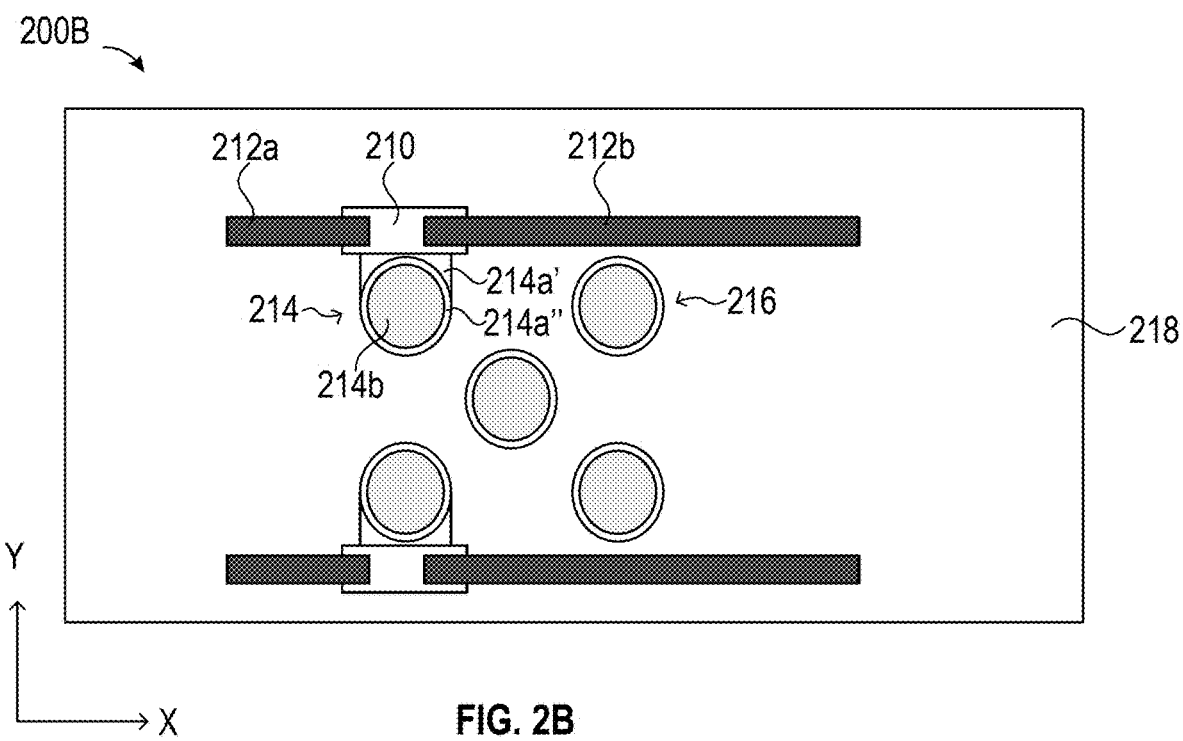
FIG. 2B is a top down view of a second 3D NAND memory device in accordance with exemplary embodiments of the disclosure.

FIG. 2B is a top down view of a 3D NAND memory device (or device) 200B according to an embodiment of the disclosure. As shown in FIG. 2B, the device 200B can include a plurality of dummy channel structures (e.g., 214 and 216), a plurality of slit structures (e.g., 212a and 212b), a plurality of BSG cut structures (e.g., 210), a plurality of word line layers, and a plurality of insulating layers (e.g., 218). Compared to the device 200A in FIG. 2A, the bottom portions of the dummy channel structures in FIG. 2B can have a larger size (e.g., width or CD) than the bottom portions of the dummy channel structures 204 in FIG. 2A. For example, the bottom portion of the dummy channel structure 214 can include a first part 214a' that is in contact with the BSG cut structure 210 and a second part 214a" from which the top portion 214b of the dummy channel structure 214 can extend.

Figure 3:
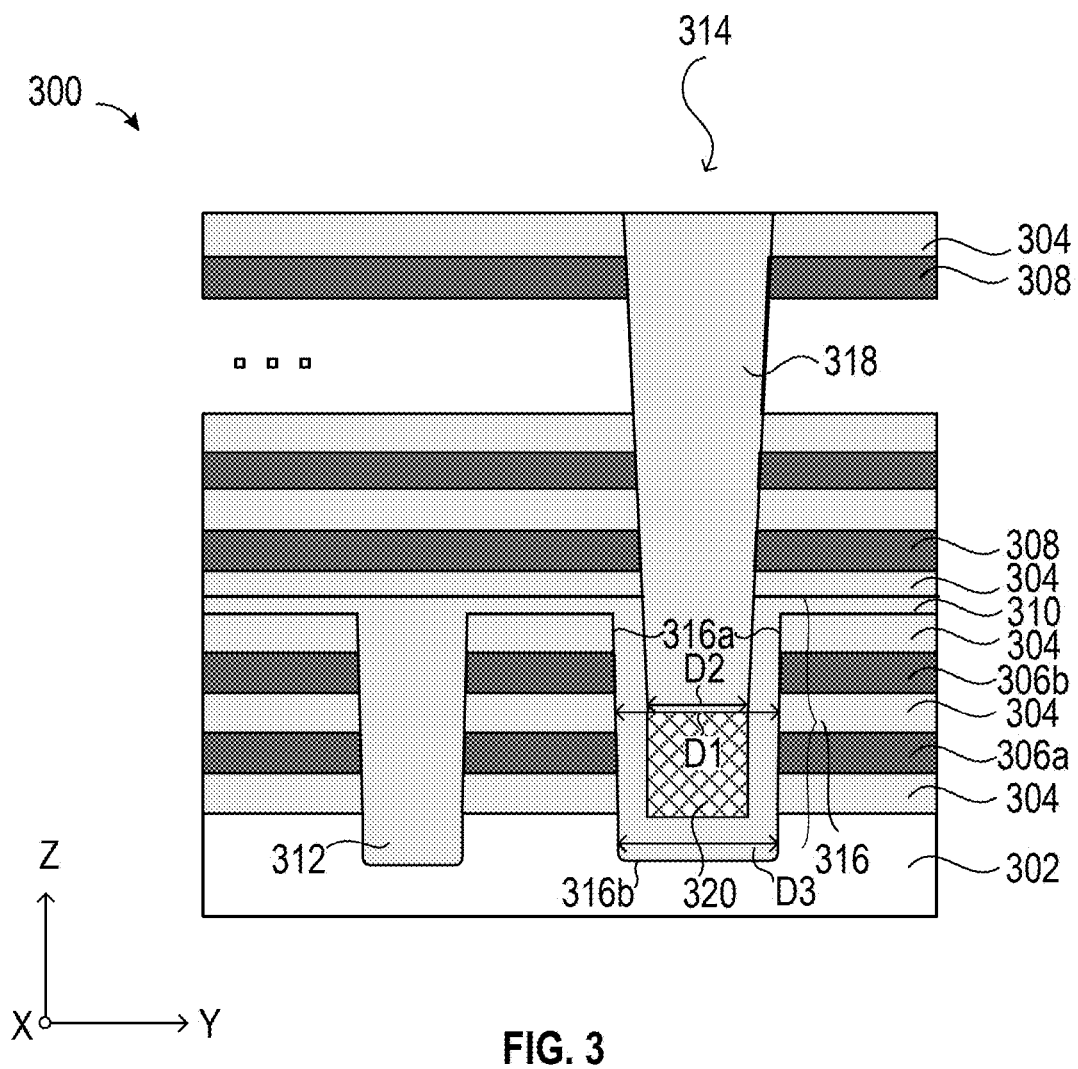
FIG. 3 is a cross-sectional view of the first 3D NAND memory device in accordance with exemplary embodiments of the disclosure.

FIG. 3 is a cross-sectional view of a 3D NAND memory device (or device) 300 according to an embodiment of the disclosure. As shown in FIG. 3, the device 300 can include one or more BSG layers 306a-306b positioned over a substrate 302, a plurality of word line layers 308 positioned over the one or more BSG layers 306a-306b, and a plurality of insulating layers 304 positioned over the substrate 302. The plurality of insulating layers 304 can be disposed alternatingly between the one or more BSG layers 306a-306b and the plurality of word line layers 308. The device 300 can include a dummy channel structure 314. The dummy channel structure 314 can include a first dielectric structure (or a bottom portion) 316 extending from the substrate 302 and through the one or more BSG layers 306a-306b, and a second dielectric structure (or a top portion) 318 extending from the first dielectric structure 316 and through the plurality of word line layers 308.

In some embodiments, the first dielectric structure 316 further can include a spacer 310 conformally formed over sidewalls 316a and a bottom 316b of the first dielectric structure 316 and a filler 320 positioned in and surrounded by (or in contact with) the spacer 310.

In some embodiments, the filler 320 can include one of a polysilicon and a dielectric material. In an embodiment of FIG. 3, the filler 320 can be a polysilicon layer. Accordingly, the second dielectric structure 318 can extend from the polysilicon layer 320 and a bottom portion of the second dielectric structure 318 further can be surrounded by (or in contact with) the spacer 310.

In some embodiments, as shown in FIGS. 2A, and 2B, a cross-section of the first dielectric structure 316 obtained along a direction (e.g., Y direction) parallel to the substrate 302 can include one of a circular shape and an oval shape. A cross-section of the second dielectric structure 318 obtained along the direction parallel to the substrate can also include one of a circular shape and an oval shape.

The device 300 can include a separation structure (or BGS cut structure) 312 extending from the substrate 302 and through the one or more BSG layers 306a-306b. As shown in FIGS. 2A and 2B, the separation structure 312 can further be positioned between the first and second slit structures (e.g., 208a and 208b) and extend in a horizontal direction (e.g., X direction).

In the device 300, a CD D1 of a top surface of the filler 320 of the first dielectric structure 316 can be larger than a CD D2 of a bottom surface of the second dielectric structure 318 that is in contact with the filler 320. Further, a CD D3 of a bottom surface of the first dielectric structure 316 can be larger than the CD D2 of the bottom surface of the second dielectric structure 318. As mentioned above, a larger bottom CD (e.g., D3) of the dummy channel structure can prevent or reduce the under etch, and improve the bottom profile of the dummy channel structure, which can in turn improve the sustaining strength of the dummy channel structure and improve the uniformity of the gouging.

It should be noted that FIG. 3 is merely an example. The device 300 can include any number of BSG layers, any number of BSG cut structures, any number of dummy channel structures, and any number of word line layers according to the circuit designs. In addition, FIG. 3 provides an exemplary dummy channel structure (e.g., 314) that includes two portions (e.g., the first dielectric structure 316 and the second dielectric structure 318). However, the dummy channel structure might include more than two portions that can be stacked over the substrate and extend through the BSG layers (e.g., 306), the word line layers (e.g., 308) and the insulating layers (e.g., 304).

In some embodiments, the substrate 302 can be a semiconductor substrate such as Si substrate. The material of the substrate 302 may also include other semiconductors such as germanium (Ge), silicon carbide (SiC), silicon germanium (SiGe), or diamond. By way of example, in some embodiments, the material of the substrate 302 may also include silicon phosphide (SiP), silicon phosphorus carbide (SiPC), a silicon-on-insulator (SOI) structure, a SiGe-on-SOI structure, a Ge-on-SOI structure, a III-VI materials, or a combination of any of the above materials. Further, the material of the substrate 302 may optionally include an epitaxial layer (epi-layer), may be strained for performance enhancement, and/or have other suitable enhancement feature.

The insulating layers 304 can be made of SiO. The BSG layers 306a-306b and the word line layers 308 can be made of W, polysilicon, or other conductive materials. The materials of the spacer 310 and the second dielectric structure 318 can include SiO, SiN, SiC, SiCN, or other suitable dielectric materials. In some embodiments, the BSG layers 306a-306b and the word line layers 308 can be formed by a dielectric material firstly, such as SiN, and function as sacrificial BSG layers and sacrificial word line layers. The sacrificial BSG layers and the sacrificial word line layers can be replaced with a conductive material, such as W, to form the BSG layers 306a-306b and the word line layers 308.

Figure 4:
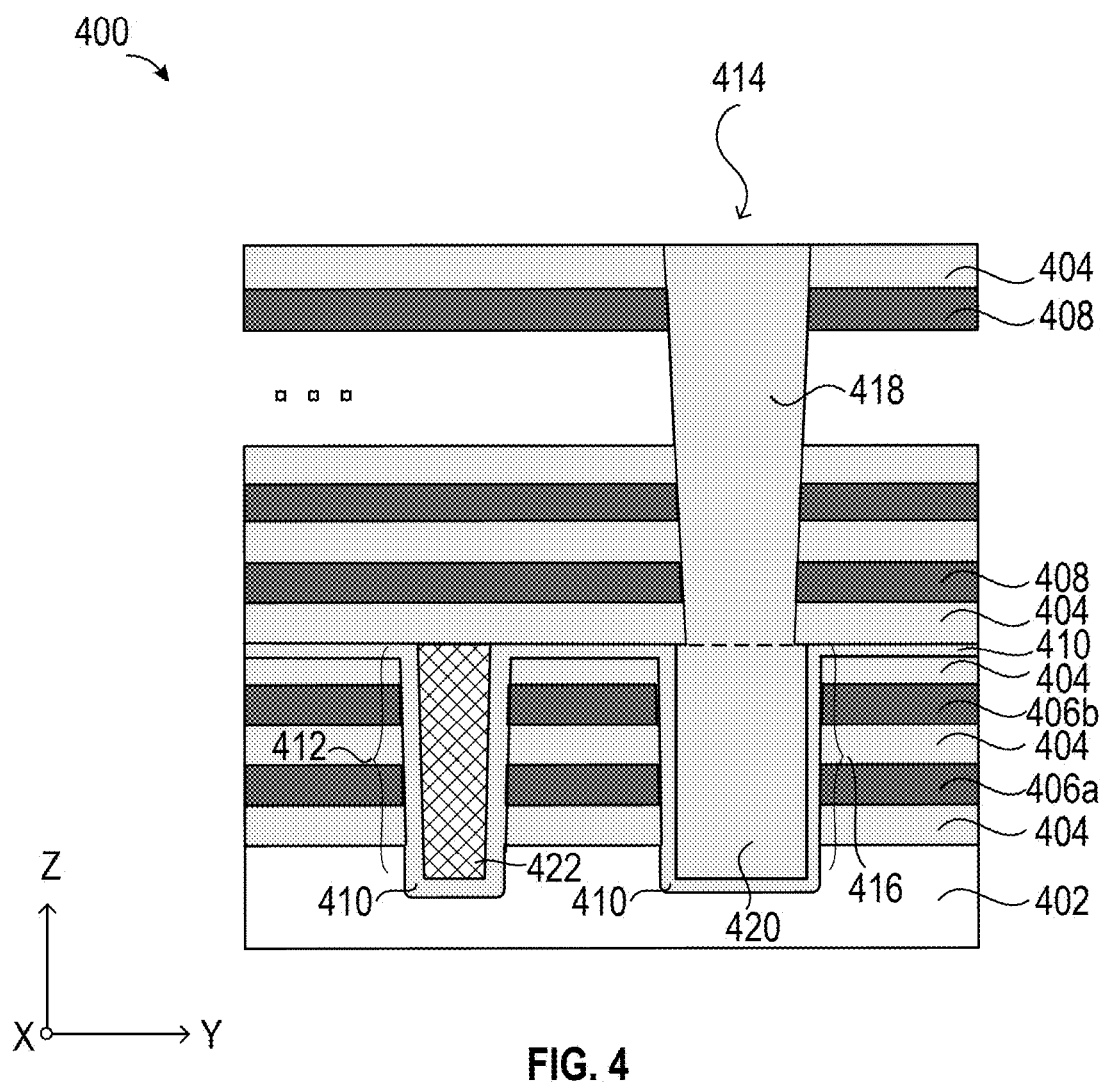
FIG. 4 is a cross-sectional view of the second 3D NAND memory device in accordance with exemplary embodiments of the disclosure.

FIG. 4 shows a cross-sectional view of a 3D NAND memory device (or device) 400 according to an embodiment of the disclosure. The device 400 can have one or more BSG layers 406a-406b formed over a substrate 402, a plurality of word line layers 408 formed over the one or more BSG layers 406a-406b, and a plurality of insulating layers 404 positioned alternatingly between the one or more BSG layers 406a-406b and the plurality of word line layers 408. The device 400 can include a separation structure (or BSG cut structure) 412 that extends from the substrate 402 and through the one or more BSG layers 406a-406b. The separation structure 412 can further include a dielectric layer (or spacer) 410 formed along sidewalls and a bottom of the separation structure 412 and a polysilicon layer 422 positioned in and surrounded by the dielectric layer 410. The device 400 can include a dummy channel structure 414 that includes a bottom portion 416 and a top portion 418. The bottom portion 416 can extend from the substrate 402 and further through the one or more BSG layers 406a-406b. The top portion 418 can extend from the bottom portion 416 and further through the word line layers 408 and the insulating layers 404 positioned over the spacer 410.

The bottom portion 416 of the dummy channel structure 414 can include the spacer 410 formed along sidewalls and a bottom of the bottom portion 416 and a filler 420 positioned in and surrounded by the spacer (or the dielectric layer) 410. In some embodiments, the spacer 410 and the filler 420 can be made of a same material. In some embodiments, the spacer 410 and the filler 420 can be made of different materials. For example, the materials of the spacer 410 and the filler 420 can include SiO, SiC, SiN, SiCN, SiCON, or the like. In some embodiments, the filler 420 can include a polysilicon. In an exemplary embodiment, the insulating layers 404, the spacer 410, and the filler 420 can be made of the same material such as SiO.

Figure 5:
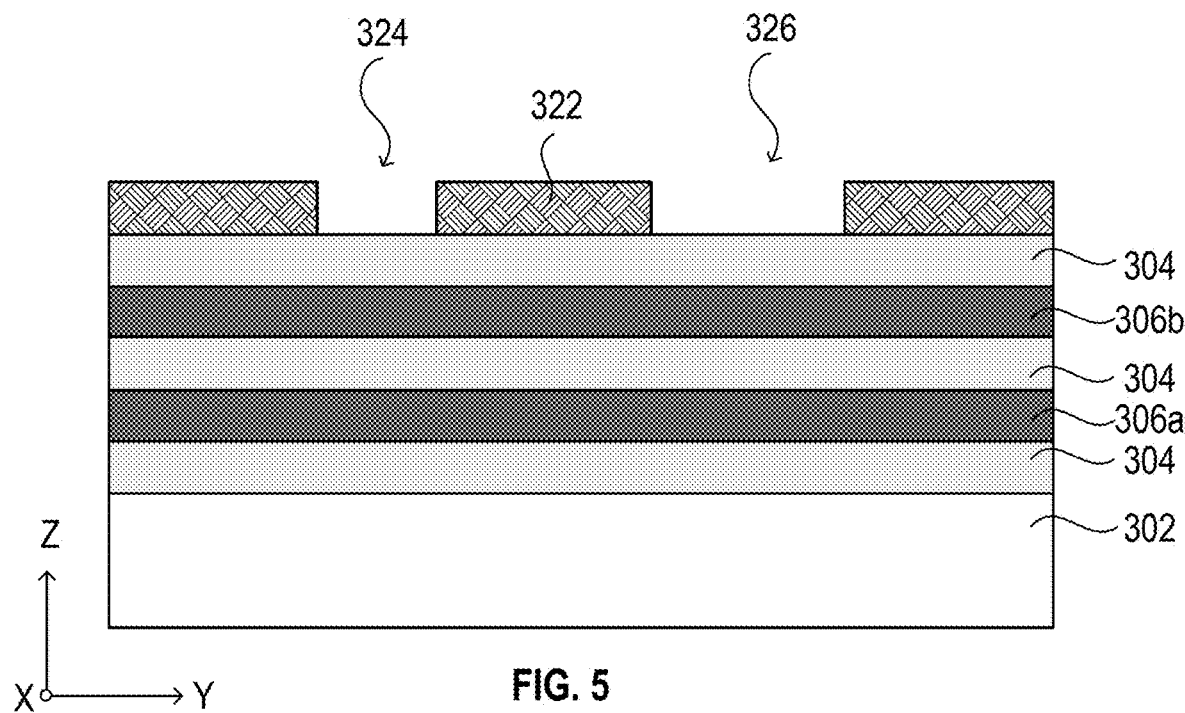
FIGS. 5-11 are cross-sectional views of various intermediate steps of manufacturing a first 3D NAND memory device, in accordance with exemplary embodiments of the disclosure.

FIGS. 5-11 are cross-sectional views of various intermediate steps of manufacturing the 3D NAND memory device (or device) 300, in accordance with exemplary embodiments of the disclosure. In FIG. 5, one or more BSG layers 306a-306b can be formed over a substrate 302, and a plurality of insulating layers 304 can be formed on top and bottom surfaces of the one or more BSG layers 306a-306b such that the one or more BSG layers 206a-206b can be spaced apart from each other by the insulating layers 304. Further, a mask layer 322 can be formed by a photolithography process over the one or more BSG layers 306a-306b and the insulating layers 304. The mask layer 322 can include a first pattern 324 and a second pattern 326 that can expose one or more portions of an uppermost insulating layer. In order to form the one or more BSG layers 306a-306b and the insulating layers 304, any suitable deposition processes can be applied, such as a chemical vapor deposition (CVD), a physical vapor deposition (PVD), an atomic layer deposition (ALD), a thermal oxidation, an e-beam evaporation, a sputtering, a diffusion, or any combination thereof. The lithography process (e.g., photolithography or e-beam lithography) can further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combination thereof.

Figure 6:
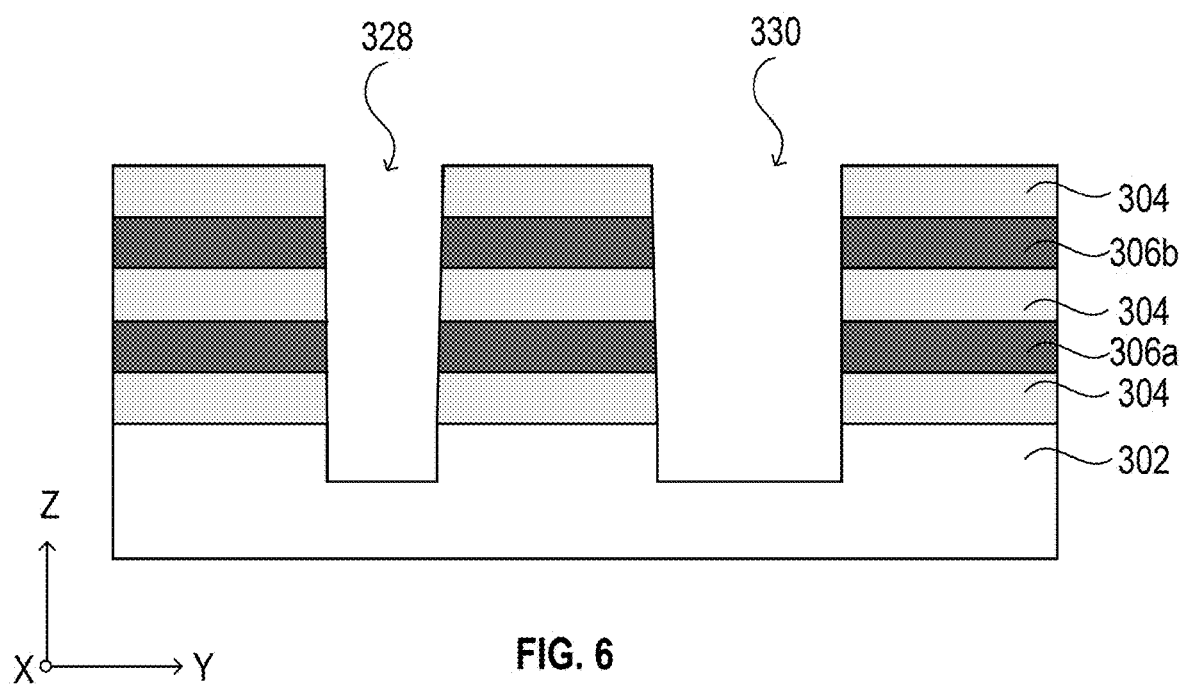

In FIG. 6, an etching process, such as a plasma dry etch process or a wet etch process, can be applied to transfer the first and second patterns 324 and 326 into the one or more BSG layers 306a-306b and the insulating layers 304. Accordingly, a trench opening 328 and a first opening 330 can be formed based on the first and second patterns 324 and 326, respectively. The trench opening 328 and the first opening 330 can extend through the one or more BSG layers 306a-306b and the insulating layers 304 and further into the substrate 302.

Figure 7:
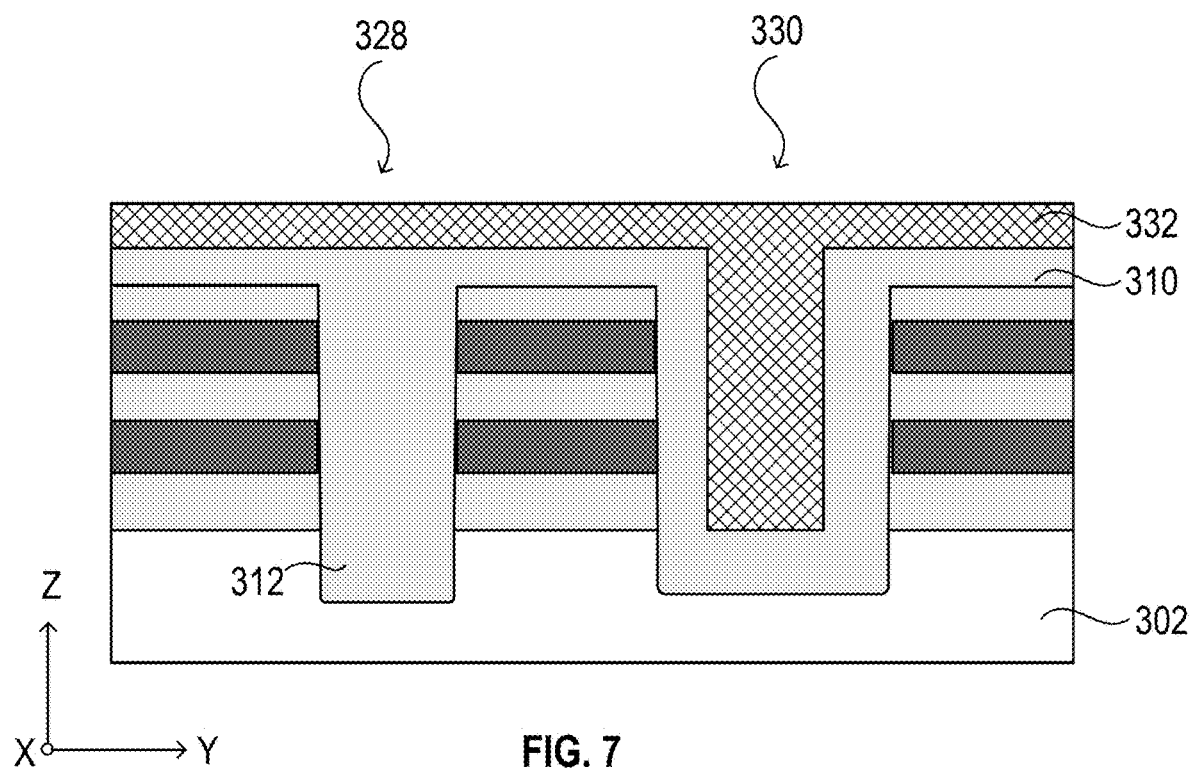

In FIG. 7, a spacer 310 can be formed along sidewalls and over a bottom of the first opening 330. The spacer 310 can further fill in the trench opening 328 fully to form a separation structure (or BGS cut structure) 312. Further, an etch stop layer 332 can be formed along sidewalls and a bottom of the spacer 310. The etch stop layer 332 can also be disposed on the spacer 310. The material of the etch stop layer 332 can include a polysilicon or a dielectric material that has a smaller etch rate than the spacer 310 or the insulating layers 304. For example, the etch stop layer 332 can have a 5-10 times smaller etch rate than the spacer 310 or the insulating layers 304. The etch stop layer 332 can prevent an etching process from penetrating the spacer 310 and extending into the substrate 302 in subsequent manufacturing processes.

Figure 8:
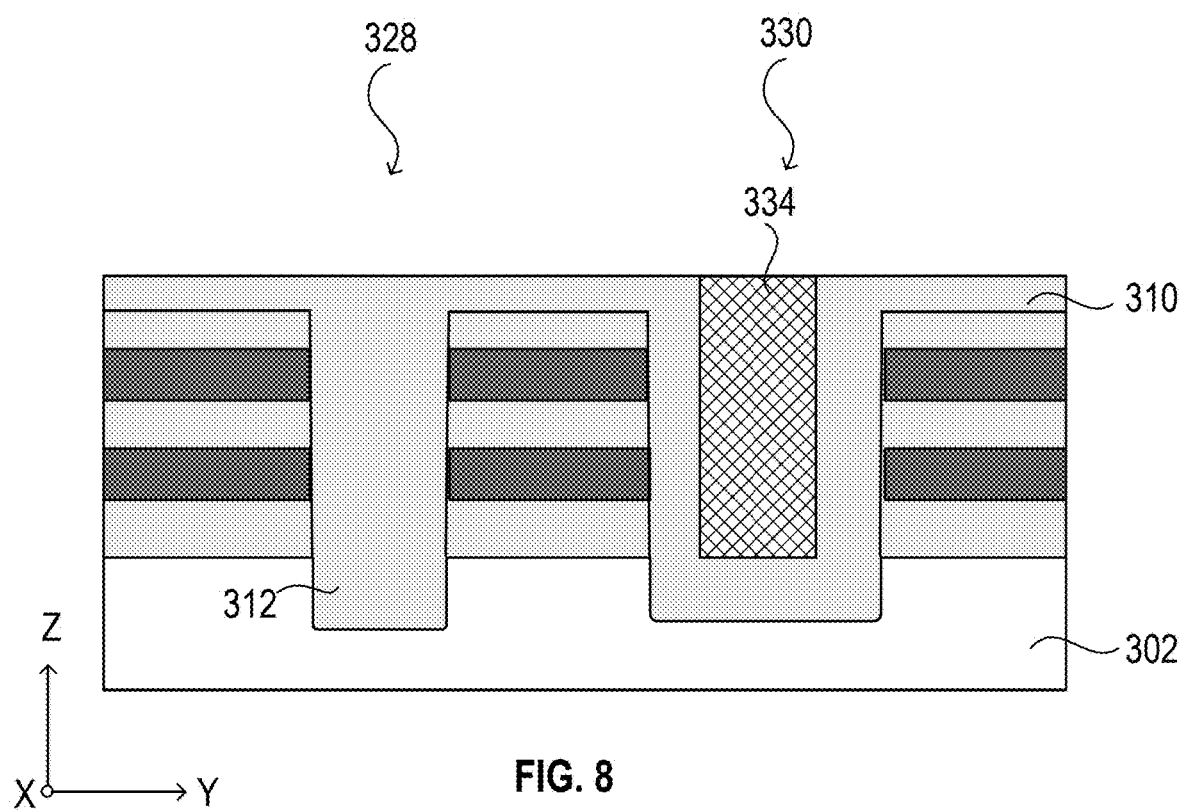

In FIG. 8, a surface planarization, such as an etch back process or a chemical-mechanical planarization (CMP) process, can be applied to remove any excessive etch stop layer 332 over the spacer 310. The etch stop layer 332 remaining in the first opening 330 can be a filler 334 that is surrounded by the spacer 310.

Figure 9:
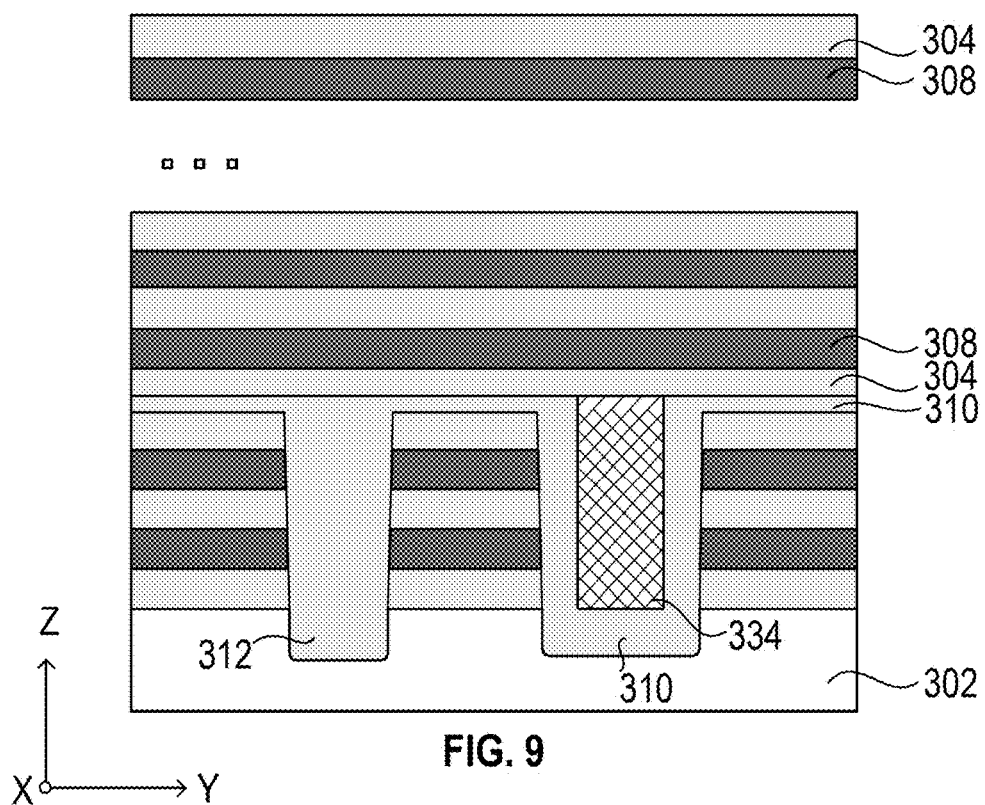

In FIG. 9, a plurality of word line layers 308 and a plurality of insulating layers 304 can be alternatingly formed over the spacer 310. In some embodiments, the word line layers 308 can be made of a dielectric material, such as SiN, and function as sacrificial word line layers. The sacrificial word line layers can then be replaced with a conductive material to form word line layers in subsequent steps. In some embodiments, the word line layers 308 can be made of a conductive material, such as polysilicon or tungsten.

Figure 10:
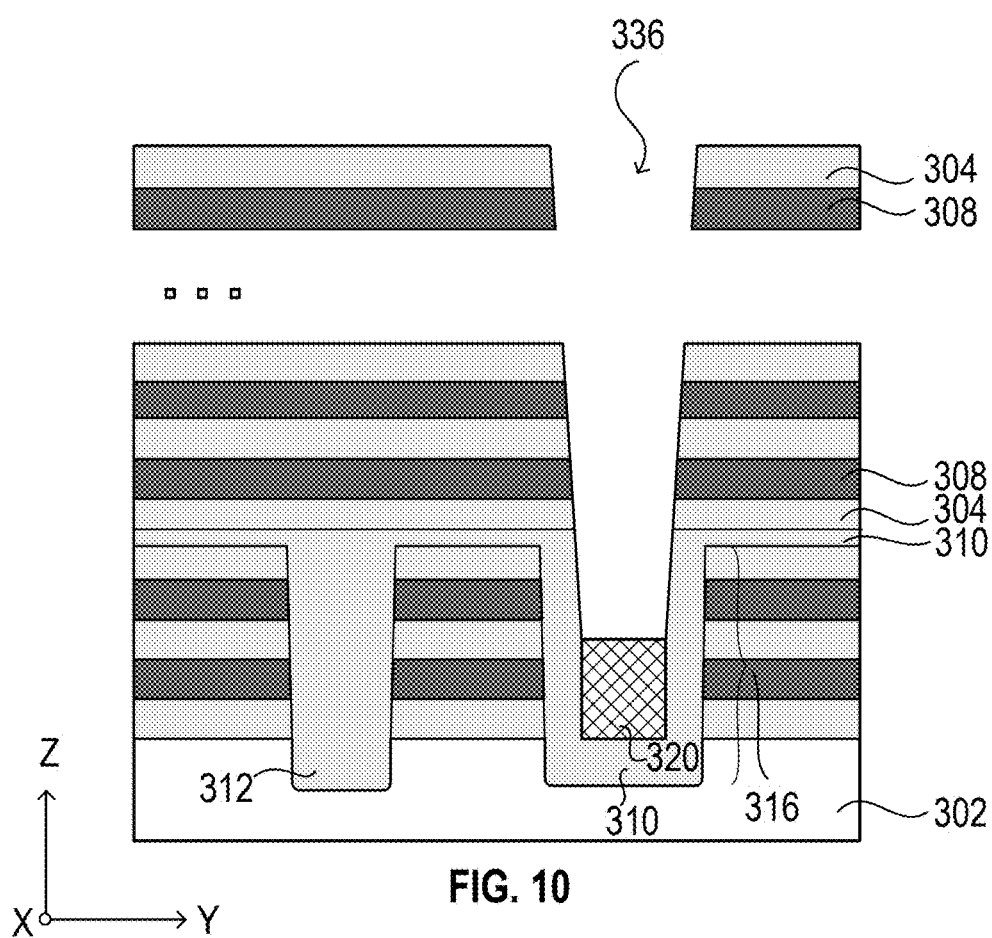

In FIG. 10, a mask layer (not shown) can be formed by a photolithography process and an etching process can subsequently be applied to form a second opening 336 based on the mask layer. The second opening 336 can extend through the word line layers 308 and the insulating layers 304 that are positioned over the spacer 310. The etching process further removes a portion of the filler 334 to form a filler 320. Accordingly, a bottom portion of the second opening 336 can further be surrounded by the spacer 310. When the second opening 336 is formed by the etching process, a bottom portion (or first dielectric structure) 316 of a dummy channel structure (e.g., 314) can be formed accordingly. The bottom portion 316 of the dummy channel structure can include the spacer 310 that extends through the one or more BSG layers 306a-306b and further into the substrate 302 and the filler 320 that is surrounded by the spacer 310. It should be noted that the filler 334 can function as an etch stop layer when the etching process etches through the word line layers 308 and the insulating layers 304 to form the second opening 336. By introducing the filler (or etch stop layer) 334, the second opening 336 can be prevented from punching through filler 334 and the spacer 310 to extend into the substrate 302.

Figure 11:
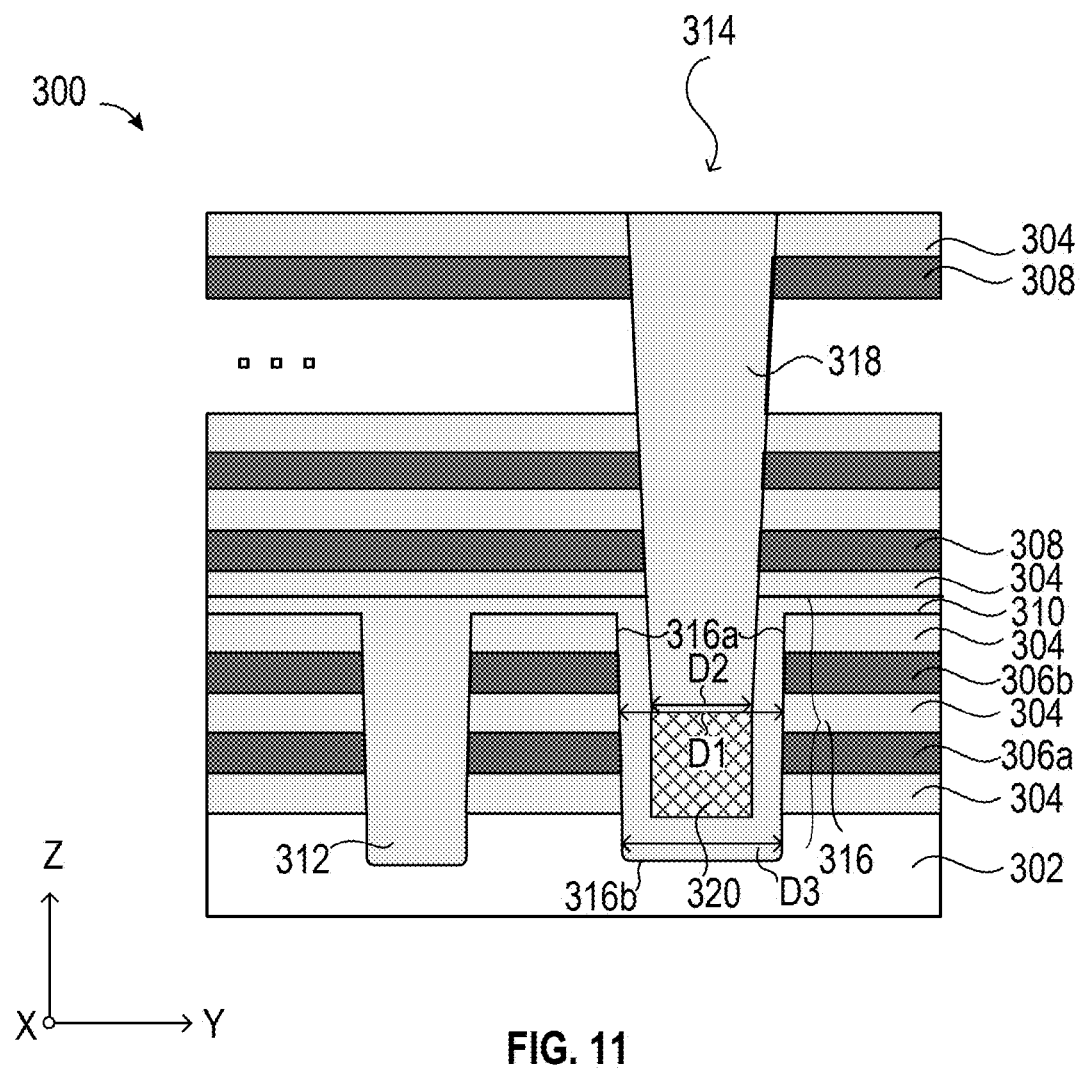

In FIG. 11, a dielectric material can be deposited to fill in the second opening 336. Any excessive dielectric material over an uppermost insulating layer 304 can further be removed by a CMP process. The dielectric material that remains in the second opening 336 can become a top portion (or second dielectric structure) 318 of the dummy channel structure 314. When the top portion 318 of the dummy channel structure 314 is formed, a device 300 can be formed accordingly. The device 300 can have similar features to the device 300 in FIG. 3. For example, the device 300 in FIG. 11 can include a dummy channel structure 314 extending through the one or more BSG layers 306-306b, the word line layers 308, and the insulating layers 304. The dummy channel structure 314 can include the bottom portion 316 positioned in the one or more BSG layers 306a-306b, and the top portion 318 positioned over the bottom portion 316.

Figure 12:
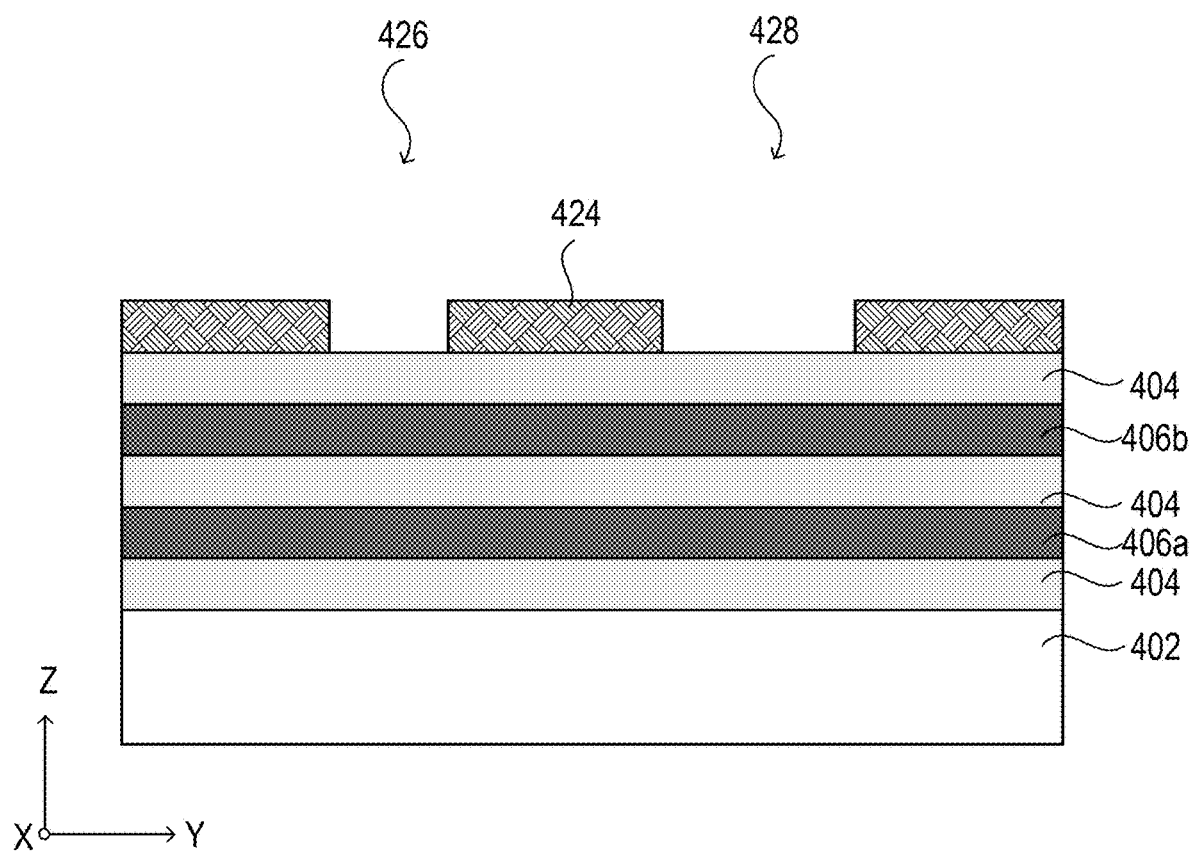
FIGS. 12-22 are cross-sectional views and top down views of various intermediate steps of manufacturing a second 3D NAND memory device, in accordance with exemplary embodiments of the disclosure.

FIGS. 12-22 are cross-sectional views and top down views of various intermediate steps of manufacturing the second 3D NAND memory device (or device) 400, in accordance with exemplary embodiments of the disclosure. In FIG. 12, one or more BSG layers 406a-406b can be formed over a substrate 402, and a plurality of insulating layers 404 can be formed on top and bottom surfaces of the one or more BSG layers 406a-406b such that the one or more BSG layers 406a-406b can be spaced apart from each other. Further, a mask layer 424 can be formed by a photolithography process over the one or more BSG layers 406a-406b and the insulating layers 404. The mask layer 424 can include a first pattern 426 and a second pattern 428 that can expose portions of an uppermost insulating layer 404.

Figure 13:
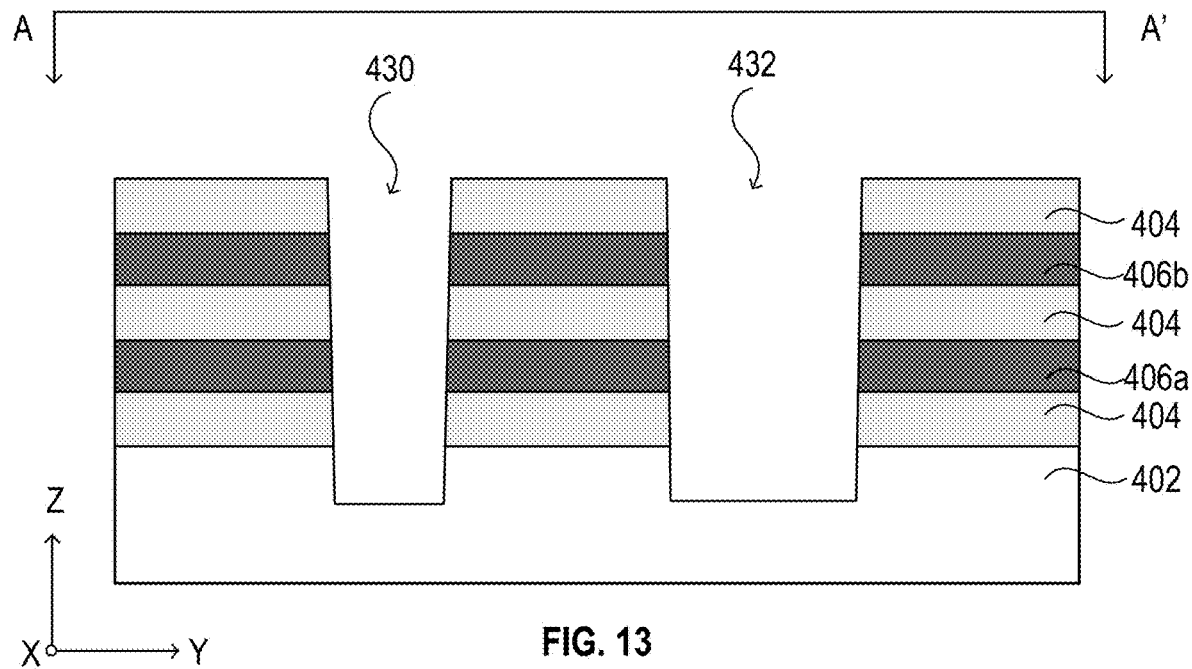
Figure 14:
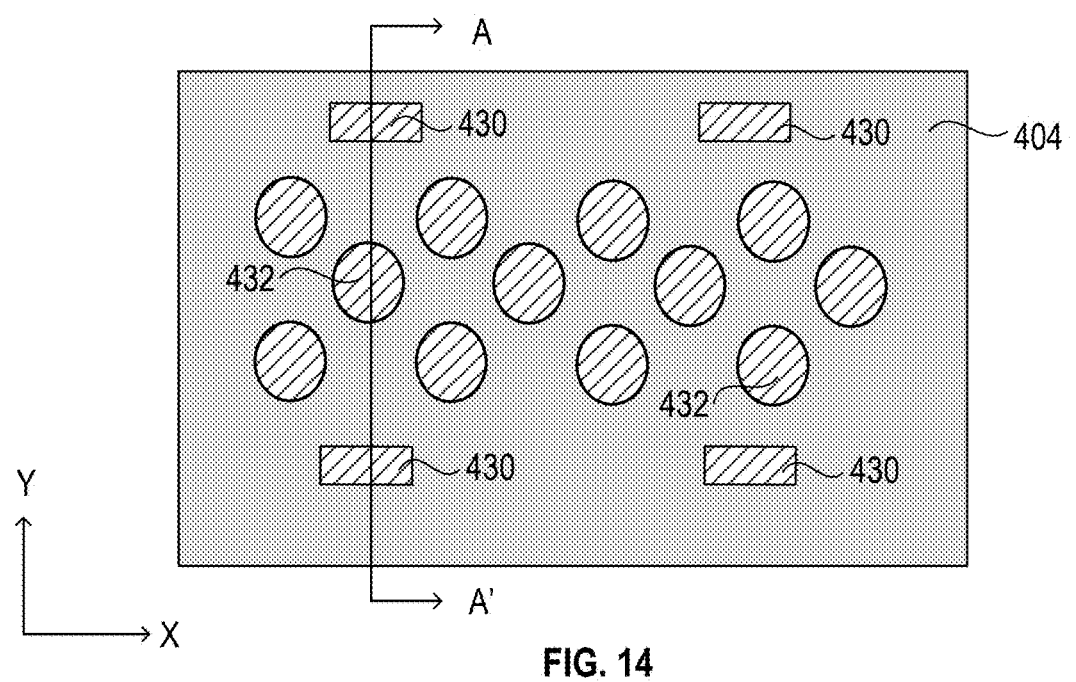

FIG. 13 is a cross-sectional view of forming a trench opening and a first opening in the one or more BSG layers and the insulating layers based on the mask layer 424. FIG. 14 is a top down view of the trench opening and the first opening in the one or more BSG layers and the insulating layers based on the mask layer 424. FIG. 13 is obtained from a same plane as a vertical plane along line A-A' in FIG. 14. As shown in FIG. 13, an etching process can be applied to transfer the first and second patterns 426 and 428 into the one or more BSG layers 406a-406b and the insulating layers 404. Accordingly, a trench opening 430 and a first opening 432 can be formed based on the first and second patterns 426 and 428, respectively. The trench opening 430 and the first opening 432 can extend through the one or more BSG layers 406a-406b and the insulating layers 404 and further into the substrate 402. In FIG. 14, a plurality of trench openings 430 and a plurality of first openings 432 can be formed. The trench openings 430 can have a rectangular profile and the first openings 432 can have a circular shape or an oval shape for example.

Figure 15:
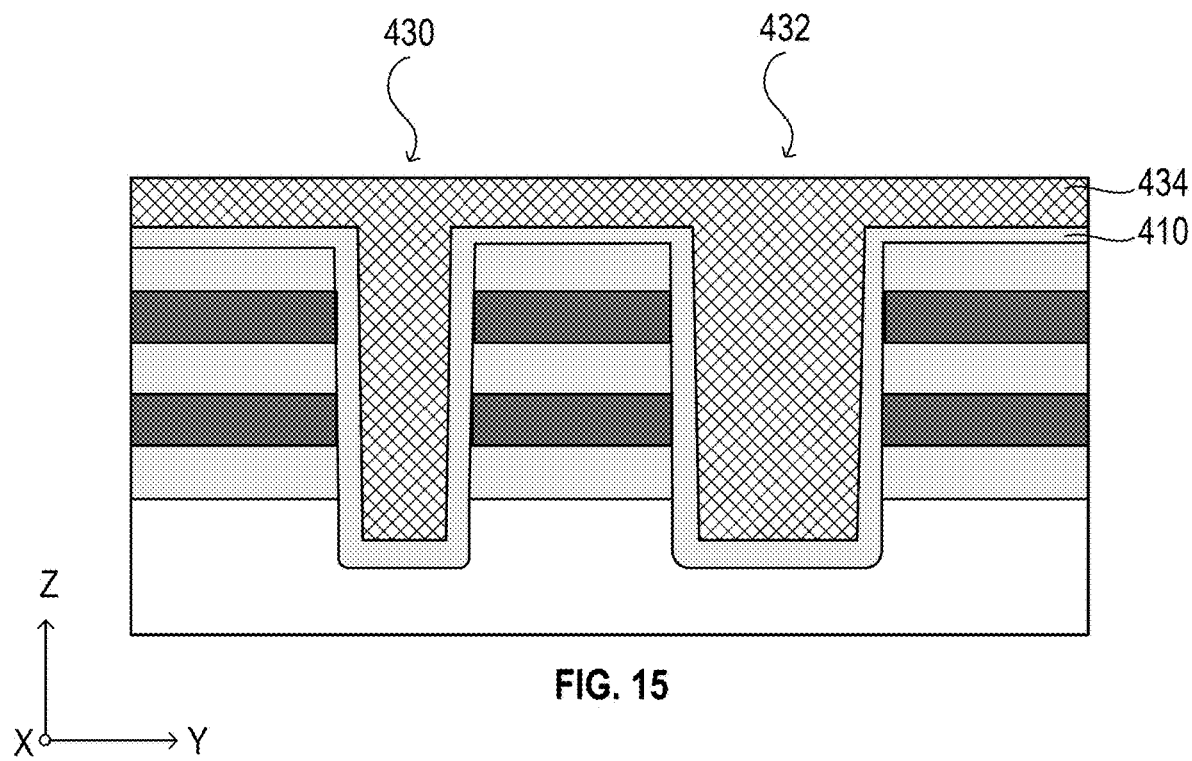

In FIG. 15, a spacer 410 can be formed along sidewalls and over bottoms of the trench opening 430 and the first opening 432. Further, an etch stop layer 434 can be formed over the spacer 410. The etch stop layer 434 can also be disposed on the spacer 410. The material of the etch stop layer 434 can include a polysilicon or a dielectric material that has a different etch rate than the spacer 410 or the insulating layers 404.

Figure 16:
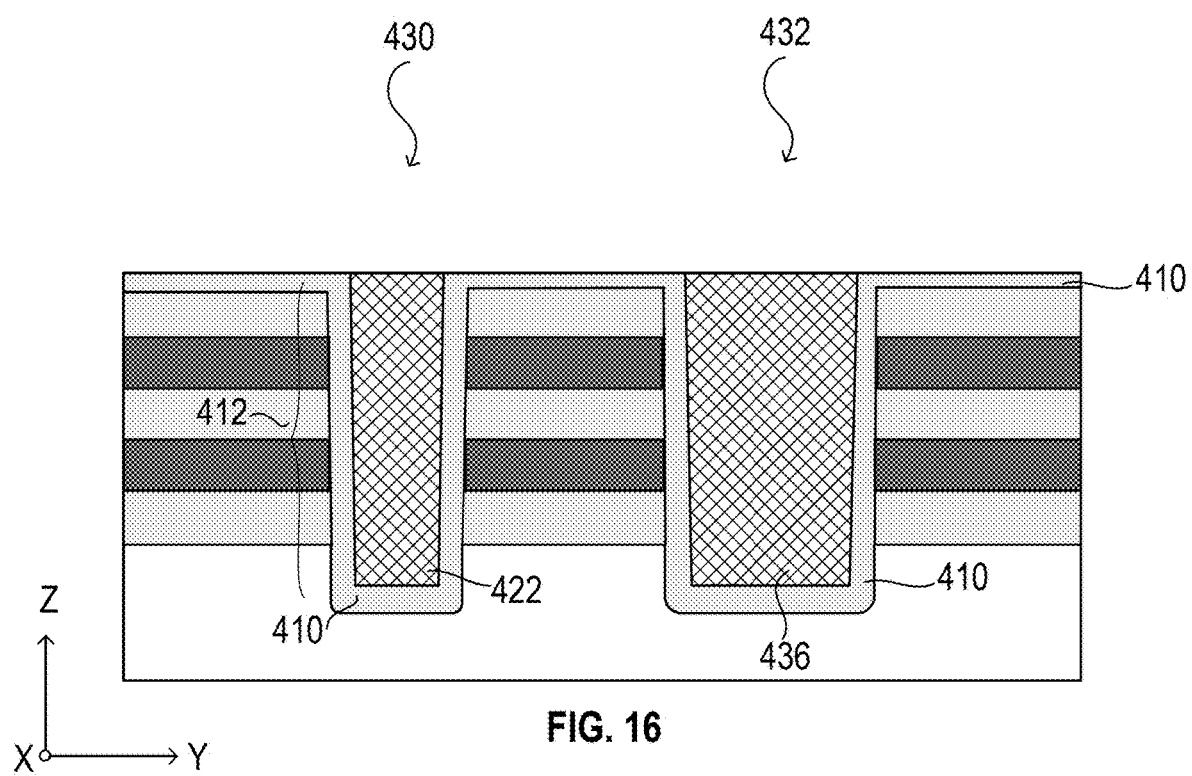

In FIG. 16, a surface planarization, such as an etch back process or a CMP process, can be applied to remove any excessive etch stop layer 434 over the spacer 410. The etch stop layer 434 remaining in the first opening 432 can be a filler 436 that is surrounded by the spacer 410. In addition, the etch stop layer 434 remaining in the trench opening 430 can be a polysilicon layer 422 that is positioned in and surrounded by the spacer 410. Accordingly, a separation structure (or BSG cut structure) 412 can be formed. The BSG cut structure 412 can include the spacer (or a dielectric layer) 410 formed along sidewalls and a bottom of the separation structure 412 and the polysilicon layer 422 positioned in and surrounded by the dielectric layer 410.

Figure 17:
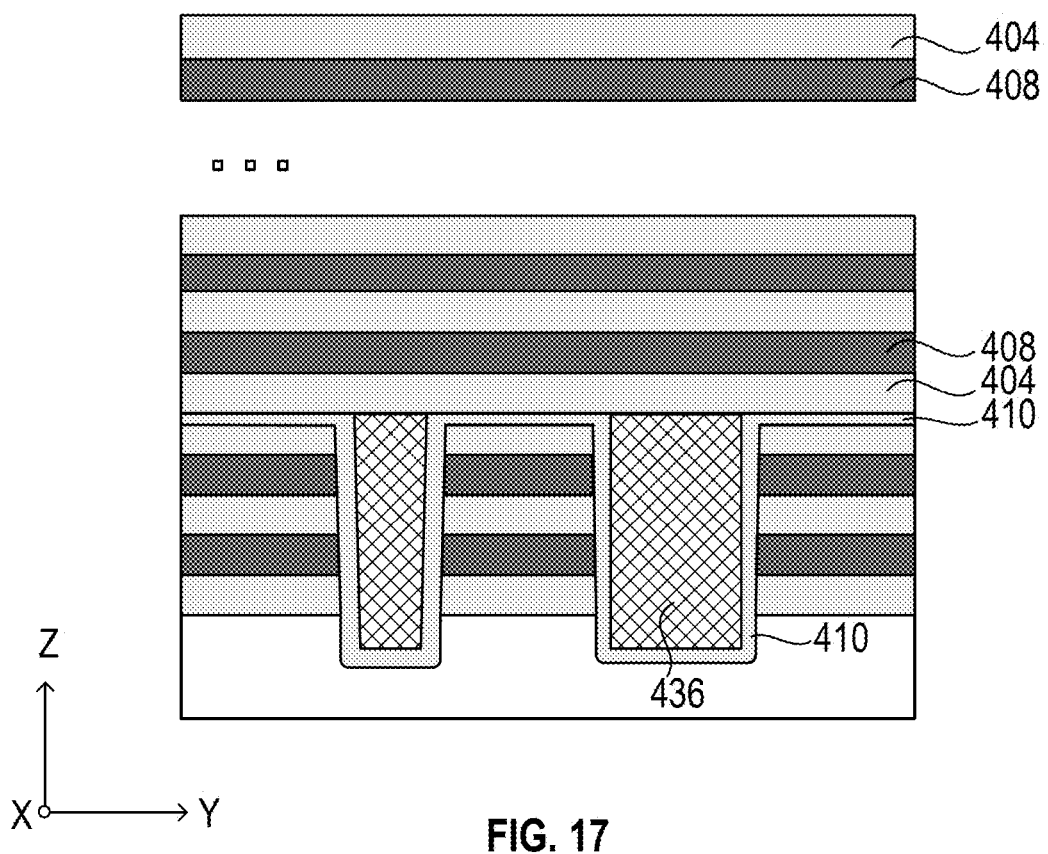

In FIG. 17, a plurality of word line layers 408 and a plurality of insulating layers 404 can be alternatingly formed over the spacer 410. In some embodiments, the word line layers 408 can be made of a dielectric material, such as SiN, and function as sacrificial word line layers. The sacrificial word line layers can then be replaced with a conductive material to form word line layers in subsequent steps.

Figure 18:
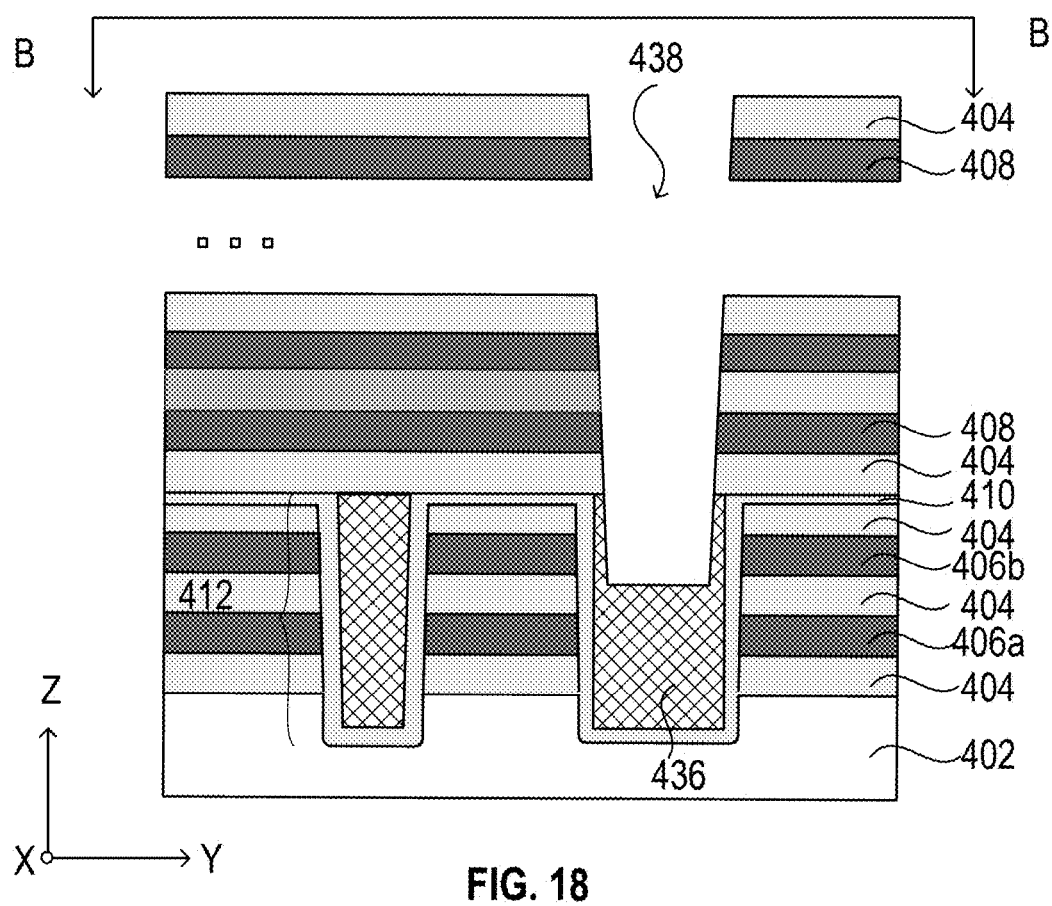
Figure 19:
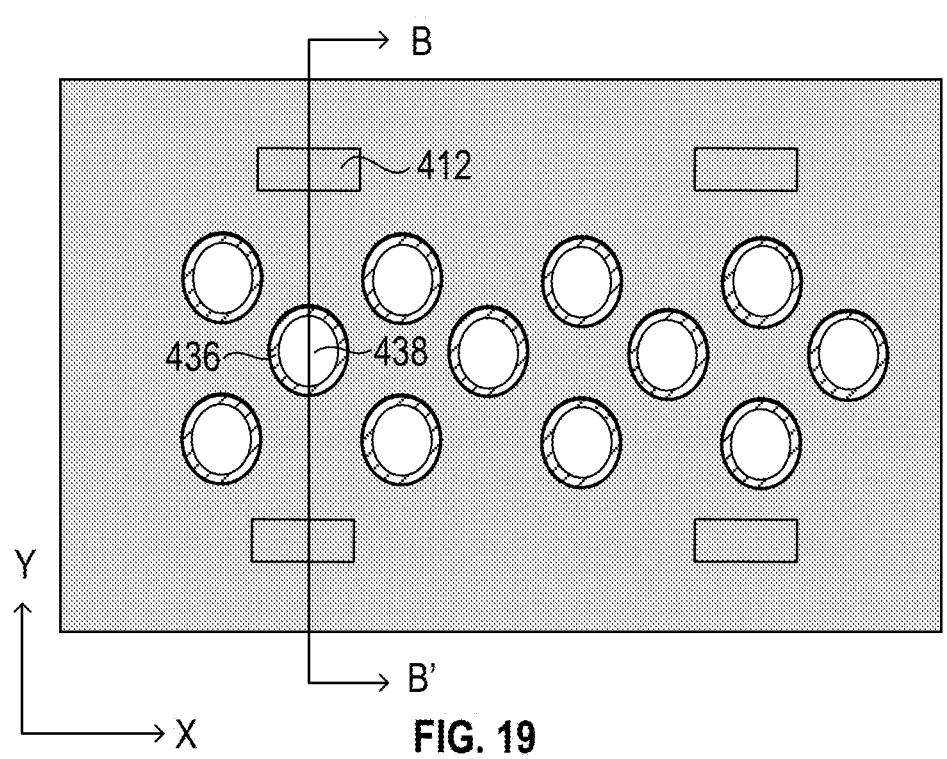

FIG. 18 is a cross-sectional view of forming a second opening in the word line layers 408 and the insulating layers 404. FIG. 19 is a top down view of second openings. FIG. 18 is obtained from a same plane as a vertical plane along line B-B' in FIG. 19. As shown in FIG. 18, an etching process can be applied to form a second opening 438. The second opening 438 can extend through the word line layers 408 and the insulating layers 404 and further into the filler 436. In FIG. 19, a plurality of second openings 438 can be formed. The plurality of second openings 438 can have a circular shape or an oval shape for example.

Figure 20:
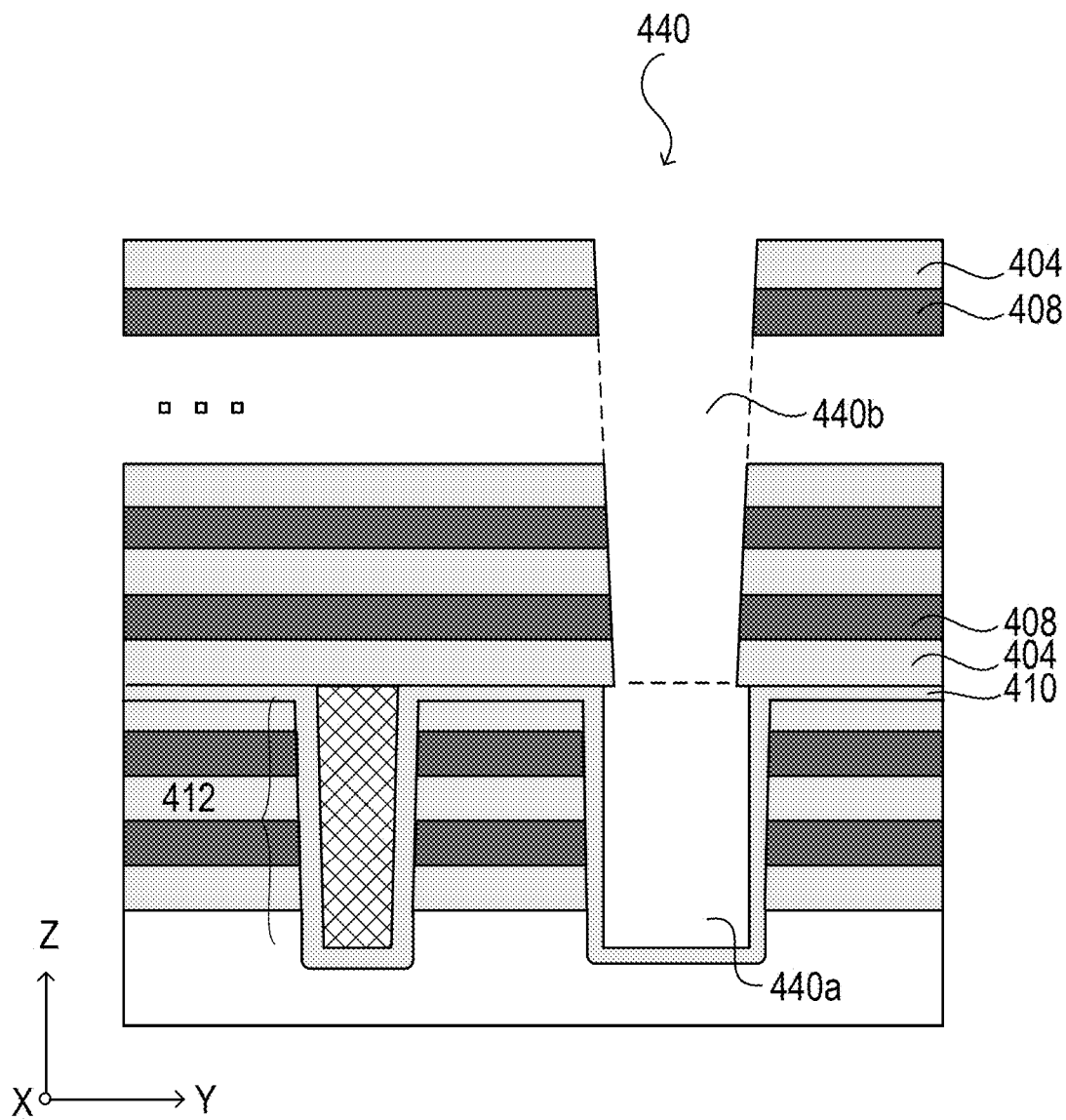

In FIG. 20, the filler 436 can be removed by an etching process, such as a wet etching process or a plasma dry etch process. For example, Tetramethylammonium Hydroxide (TMAH) can be applied to remove the filler 436 when the filler 436 is made of polysilicon. The etching process can be a selective removal process such that the filler 436 can be removed and the spacer 410 can still remain. When the filler 436 is removed, a third opening 440 can be formed. The third opening 440 can include a bottom portion 440a and a top portion 440b. The bottom portion can extend through one or more BSG layers 406a-406b and further into the substrate 402, and be surrounded by the spacer 410. The top portion 440b can extend from the bottom portion 440a and through the word line layers 408 and the insulation layers 404 positioned over the spacer 410.

Figure 21:
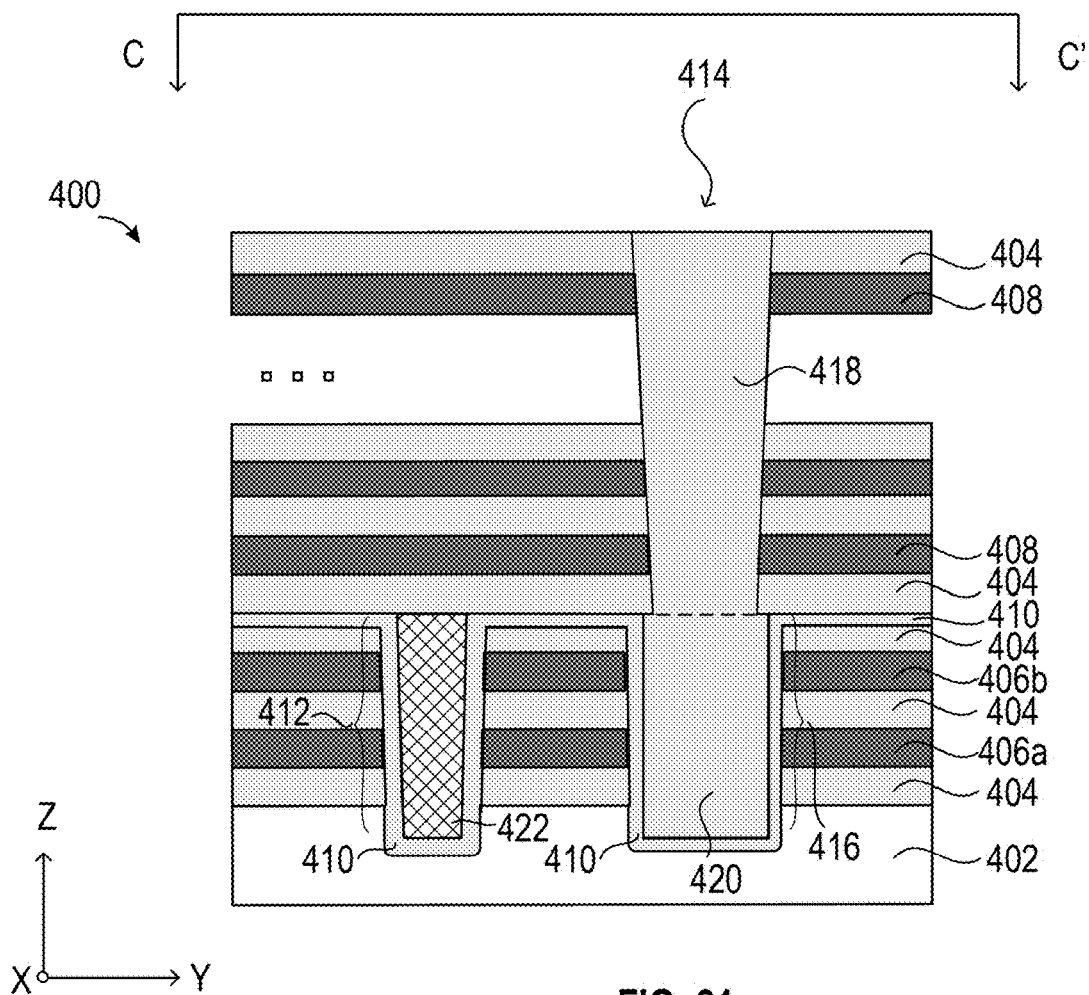
Figure 22:
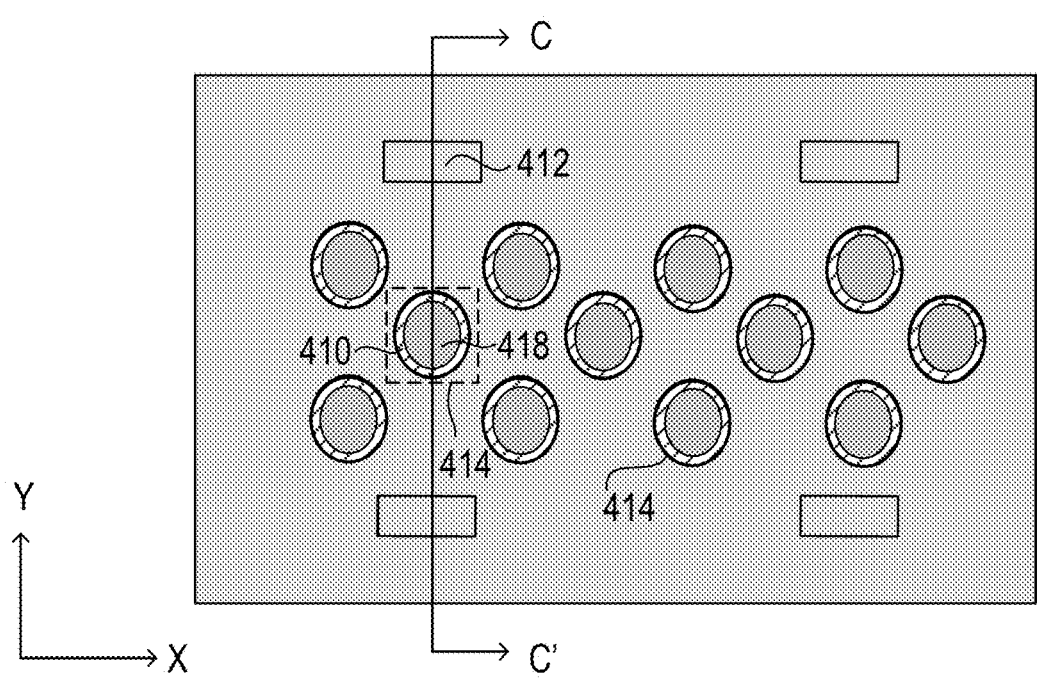

FIG. 21 is a cross-sectional view of forming a dummy channel structure by filling the third opening 440 with a dielectric material. FIG. 22 is a top down view of dummy channel structures. FIG. 21 is obtained from a same plane same as a vertical plane along line C-C' in FIG. 22. As shown in FIG. 21, a dielectric material, such as SiO, can be applied to fill the third opening 440. Accordingly, a dummy channel structure 414 can be formed. The dielectric material positioned in the bottom portion 440a of the third opening 440 can become a filler 420. The filler 420 and the spacer 410 can form a bottom portion 416 of the dummy channel structure 414. In some embodiments, the spacer 410 and the filler 420 can be made of a same material. In some embodiments, the spacer 410 and the filler 420 can be made of different materials. The dielectric material positioned in the top portion 440b of the third opening 440 can become a top portion 418 of the dummy channel structure 414. When the dummy channel structure 414 is formed, a device 400 can be formed accordingly, which can have similar features to the device 400 in FIG. 4. In FIG. 22, a plurality of dummy channel structures 414 can be formed when the third openings 440 are filled with the dielectric material. The dummy channel structures 414 can have a circular shape or an oval shape.

Figure 23:
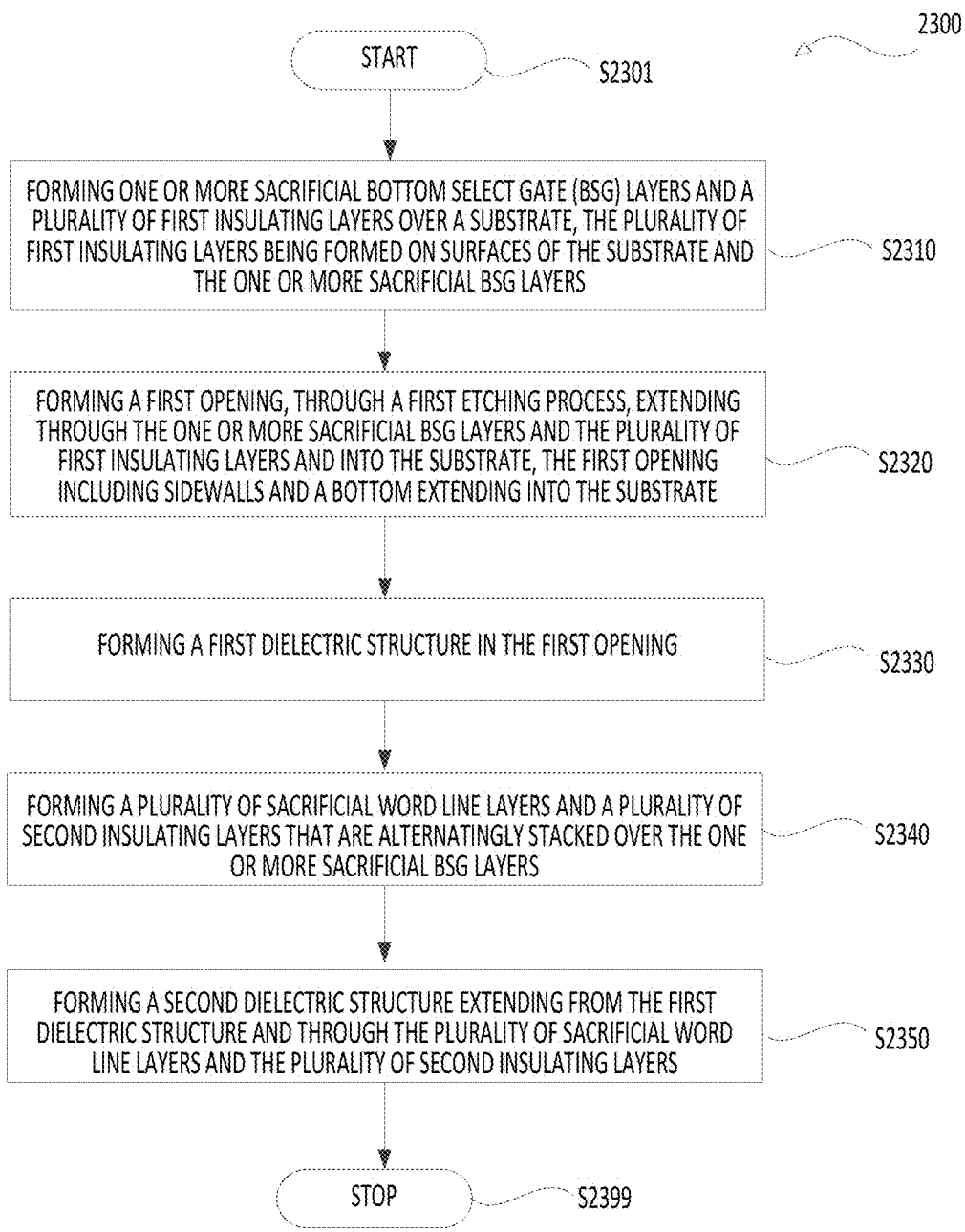
FIG. 23 is a flowchart of a process for manufacturing a 3D NAND memory device, in accordance with exemplary embodiments of the disclosure.

FIG. 23 is a flowchart of an exemplary process 2300 for fabricating a 3D NAND memory device. The process 2300 begins with S2301, and then proceeds to S2310. At S2310, one or more BSG layers and a plurality of first insulating layers can be formed over a substrate. The plurality of first insulating layers can be formed on surfaces of the substrate and the one or more sacrificial BSG layers. In some embodiments, S2310 can be performed as illustrated with reference to FIG. 5 or FIG. 12.

At S2320, a first opening can be formed, through a first etching process, to extend through the one or more sacrificial BSG layers and the plurality of first insulating layers and further into the substrate. The first opening can include sidewalls and a bottom extending into the substrate. In some embodiments, S2320 can be performed as illustrated with reference to FIG. 6 or FIGS. 13-14.

The process 2300 then proceeds to S2330, where a first dielectric structure can subsequently be formed in the first opening. In order to form the first dielectric structure in the first opening, a dielectric material can be conformally deposited through a first deposition process to form a spacer along the sidewalls and over the bottom of the first opening. A polysilicon can further be deposited over the spacer in the first opening through a second deposition process to form a filler. In some embodiments, S2330 can be performed as illustrated with reference to FIGS. 7-8 or FIGS. 15-16.

At S2340, a plurality of sacrificial word line layers and a plurality of second insulating layers can be formed to be alternatingly stacked over the one or more sacrificial BSG layers. In some embodiments, S2340 can be performed as illustrated with reference to FIG. 9 of FIG. 17.

At S2350, a second dielectric structure can be formed to extend from the first dielectric structure and through the plurality of sacrificial word line layers and the plurality of second insulating layers. In some embodiments, S2350 can be performed as illustrated with reference to FIGS. 10-11 or FIGS. 18-22.

In some embodiments, a critical dimension (CD) of a top surface of the filler of the first dielectric structure can be larger than a CD of a bottom surface of the second dielectric structure, and a CD of a bottom surface of the first dielectric structure can be larger than the CD of the bottom surface of the second dielectric structure.

In the process 2300, as shown in FIGS. 18-21, to form the second dielectric structure, a second opening can be formed to extend through the plurality of sacrificial word line layers and the plurality of second insulating layers and further into the filler. The filler can be removed to form a third opening, where the third opening can include a bottom portion in contact with the spacer and a top portion in contact with the plurality of sacrificial word line layers and the plurality of second insulating layers. The third opening can be filled to form the second dielectric structure in the top portion of the third opening.

In the process 2300, as shown in FIGS. 13-16, a trench opening can be formed through the first etching process. The trench opening can be formed to extend through the one or more sacrificial BSG layers and further extend in a horizontal direction parallel to the substrate. The trench opening can include sidewalls and a bottom extending into the substrate. The dielectric material can be conformally deposited through the first deposition process to form a dielectric layer along the sidewalls and over the bottom of the trench opening. The polysilicon can be deposited over the dielectric layer in the trench opening through the second deposition process to form a separation structure.

In some embodiments, in order to form the second dielectric structure, as shown in FIGS. 10 and 11, a second etching process can be performed to form a second opening. The second opening can extend through the plurality of sacrificial word line layers and the plurality of second insulating layers to expose the filler. The second etching process can further remove a portion of the filler. The second opening can be filled with a dielectric material to form the second dielectric structure such that the second dielectric structure extends from the filler and a bottom portion of the second dielectric structure is in contact with the spacer.

In some embodiments, the filler can be configured to be an etch stop layer to prevent the second etching process from extending through the first dielectric structure.

In the process 2300, as shown in FIGS. 6 and 7, a trench opening can be formed through the first etching process. The trench opening can extend through the one or more sacrificial BSG layers and the plurality of first insulating layers and into the substrate. The trench opening can be filled with the dielectric material through the first deposition process to form a separation structure.

In the process 2300, as shown in FIGS. 2A and 2B, a first slit structure can be formed to extend through the one or more sacrificial BSG layers and the sacrificial word line layers and into the substrate. The first slit structure can further extend along the horizontal direction. A second slit structure can be formed to extend through the one or more sacrificial BSG layers and the sacrificial word line layers and into the substrate, where the second slit structure can be positioned along a same line as the first slit structure in the horizontal direction. Accordingly, the separation structure can extend through the one or more sacrificial BSG layers and the plurality of first insulating layers. The separation structure can be positioned between the first and second slit structures, and further extend in the horizontal direction.

In some embodiments, the one or more sacrificial BSG layers and the plurality of sacrificial word line layers can be replaced with a conductive material to form one or more BSG layers and a plurality of word line layers.

It should be noted that additional steps can be provided before, during, and after the process 2300, and some of the steps described can be replaced, eliminated, or performed in different order for additional embodiments of the process 2300. In subsequent process steps, various additional interconnect structures (e.g., metallization layers having conductive lines and/or VIAs) may be formed over the 3D NAND memory device (e.g., 300). Such interconnect structures electrically connect the 3D NAND memory device with other contact structures and/or active devices to form functional circuits. Additional device features such as passivation layers, input/output structures, and the like may also be formed.

Figure 24:
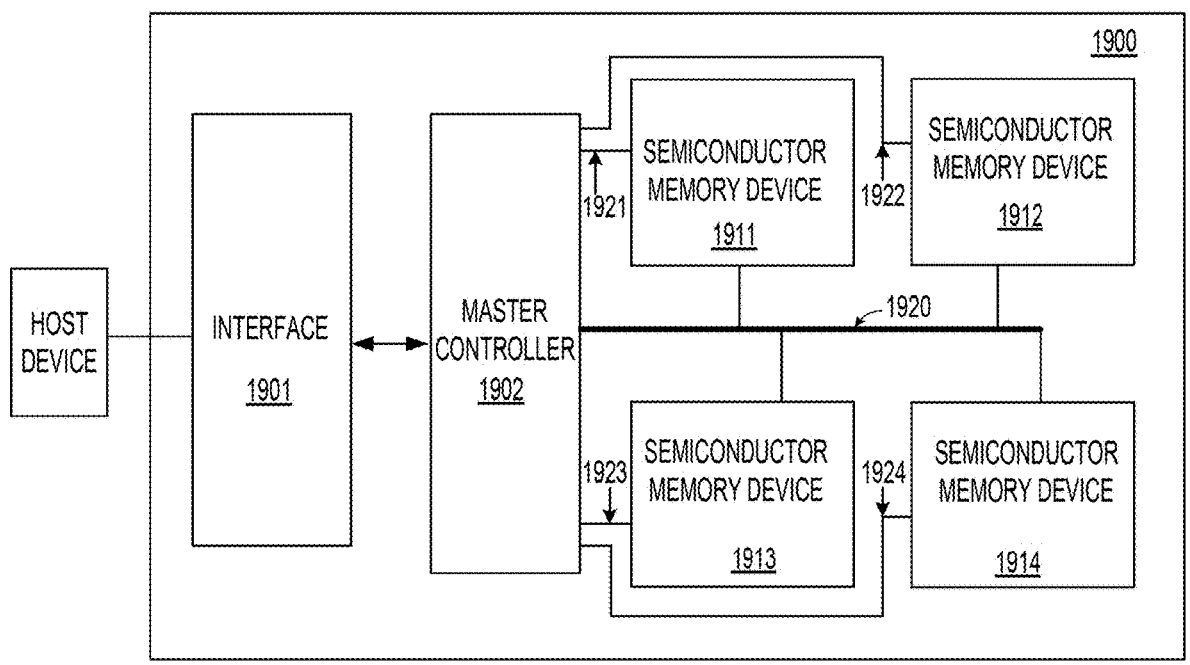
FIG. 24 is a block diagram of a memory system device, in accordance with exemplary embodiments of the disclosure.

FIG. 24 shows a block diagram of a memory system device 1900 according to some examples of the disclosure. The memory system device 1900 includes one or more semiconductor memory devices, such as shown by semiconductor memory devices 1911-1914, that can be respectively configured similarly as the device 300 in FIG. 3 or the device 400 shown in FIG. 4. In some examples, the memory system device 1900 is a solid state drive (SSD) or a memory module.

The memory system device 1900 can include other suitable components. For example, the memory system device 1900 includes an interface (or master interface circuitry) 1901 and a master controller (or master control circuitry) 1902 coupled together as shown in FIG. 24. The memory system device 1900 can include a bus 1920 that couples the master controller 1902 with the semiconductor memory devices 1911-1914. In addition, the master controller 1902 is connected with the semiconductor memory devices 1911-1914 respectively, such as shown by respective control lines 1921-1924.

The interface 1901 is suitably configured mechanically and electrically to connect between the memory system device 1900 and a host device, and can be used to transfer data between the memory system device 1900 and the host device.

The master controller 1902 is configured to connect the respective semiconductor memory devices 1911-1914 to the interface 1901 for data transfer. For example, the master controller 1902 is configured to provide enable/disable signals respectively to the semiconductor memory devices 1911-1914 to activate one or more semiconductor memory devices 1911-1914 for data transfer.

The master controller 1902 is responsible for the completion of various instructions within the memory system device 1900. For example, the master controller 1902 can perform bad block management, error checking and correction, garbage collection, and the like. In some embodiments, the master controller 1902 is implemented using a processor chip. In some examples, the master controller 1902 is implemented using multiple master control units (MCUs).

The various embodiments described herein offer several advantages over related examples. In the disclosure, the dummy channel structure can be formed to include a bottom portion positioned in the BSG layers and a top portion extending from the bottom portion. In an embodiment, the bottom portion of the dummy channel structure can be formed together with the BSG cut structures to share one or more manufacturing processes to save process time and cost. In another embodiment, the bottom portion of the dummy channel structure and the BSG cut structure can be made using different processes. The bottom portion can have a larger CD compared to a CD of the dummy channel structure in the related example. The larger CD can prevent the under etch, and improve the bottom profile of the dummy channel structure, which can in turn improve the sustaining strength of the dummy channel structure and improve the uniformity of the gouging. The bottom portion can also include a stop layer (e.g., a polysilicon layer) to improve a process window of the formation of the dummy channel structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   one or more bottom select gate (BSG) layers positioned over a substrate;
   a plurality of word line layers positioned over the one or more BSG layers;
   a plurality of insulating layers positioned over the substrate, and disposed on surfaces of the substrate, the one or more BSG layers, and the plurality of word line layers;
   a first dielectric structure extending from the substrate and through the one or more BSG layers; and
   a second dielectric structure extending from the first dielectric structure and through the plurality of word line layers,
   wherein the first dielectric structure further comprises:
   a spacer structure conformally formed over sidewalls and a bottom of the first dielectric structure and at most only a portion of sidewalls of the second dielectric structure; and
   a filler positioned in and in contact with the spacer structure.

2. The semiconductor device according to claim 1, wherein:
   a critical dimension (CD) of a top surface of the filler of the first dielectric structure is larger than a CD of a bottom surface of the second dielectric structure, and a CD of a bottom surface of the first dielectric structure is larger than the CD of the bottom surface of the second dielectric structure.

3. The semiconductor device according to claim 1, wherein the filler includes one of a polysilicon and a dielectric material, the filler being configured to be an etch stop layer to prevent the second dielectric structure from extending through the first dielectric structure.

4. The semiconductor device according to claim 1, wherein the second dielectric structure extends from the filler and a bottom portion of the second dielectric structure is in contact with the spacer structure.

5. The semiconductor device according to claim 1, further comprising:
   a first slit structure extending through the one or more BSG layers and the plurality of word line layers and further into the substrate, the first slit structure further extending along a horizontal direction parallel to the substrate;
   a second slit structure extending through the one or more BSG layers and the plurality of word line layers and further into the substrate, the second slit structure being positioned along a same line as the first slit structure in the horizontal direction; and
   a separation structure extending through the one or more BSG layers and further into the substrate, the separation structure further being positioned between the first and second slit structures and extending in the horizontal direction.

6. The semiconductor device according to claim 5, wherein the separation structure includes a dielectric layer that is formed together with the spacer structure of the first dielectric structure based on a deposition process.

7. The semiconductor device according to claim 5, wherein the first dielectric structure is further positioned adjacent to and in contact with the separation structure.

8. The semiconductor device according to claim 5, wherein the separation structure further comprises:
   a dielectric layer conformally formed along sidewalls and a bottom of the separation structure; and
   a polysilicon layer positioned in and in contact with the dielectric layer.

9. The semiconductor device according to claim 8, wherein:
   the dielectric layer of the separation structure and the spacer structure of the first dielectric structure are formed based on a first deposition process, and
   the polysilicon layer of the separation structure and the filler of the first dielectric structure are formed based on a second deposition process.

10. The semiconductor device according to claim 1, further comprising:
    a dummy channel structure including the first dielectric structure and the second dielectric structure.

11. The semiconductor device according to claim 1, wherein the semiconductor device includes a three-dimensional NAND flash memory device.

12. A memory system device, comprising:
    control circuitry coupled with a memory device; and
    the memory device including:
    one or more bottom select gate (BSG) layers positioned over a substrate;
    a plurality of word line layers positioned over the one or more BSG layers;

a plurality of insulating layers positioned over the substrate, and disposed on surfaces of the substrate, the one or more BSG layers, and the plurality of word line layers;

a first dielectric structure extending from the substrate and through the one or more BSG layers; and a second dielectric structure extending from the first dielectric structure and through the plurality of word line layers, wherein the first dielectric structure further comprises:

a spacer structure conformally formed over sidewalls and a bottom of the first dielectric structure and at most only a portion of sidewalls of the second dielectric structure; and a filler positioned in and in contact with the spacer structure.

13. The memory system device according to claim 12, wherein the spacer structure surrounds the portion of the sidewalls of the second dielectric structure.

14. The memory system device according to claim 12, wherein the spacer structure does not surround the sidewalls of the second dielectric structure.

15. The memory system device according to claim 12, wherein:

a critical dimension (CD) of a top surface of the filler of the first dielectric structure is larger than a CD of a bottom surface of the second dielectric structure, and a CD of a bottom surface of the first dielectric structure is larger than the CD of the bottom surface of the second dielectric structure.

16. The memory system device according to claim 12, wherein the filler includes one of a polysilicon and a dielectric material, the filler being configured to be an etch stop layer to prevent the second dielectric structure from extending through the first dielectric structure.

17. The memory system device according to claim 12, wherein the second dielectric structure extends from the filler and a bottom portion of the second dielectric structure is in contact with the spacer structure.

18. The memory system device according to claim 12, further comprising:

a first slit structure extending through the one or more BSG layers and the plurality of word line layers and further into the substrate, the first slit structure further extending along a horizontal direction parallel to the substrate;

a second slit structure extending through the one or more BSG layers and the plurality of word line layers and further into the substrate, the second slit structure being positioned along a same line as the first slit structure in the horizontal direction; and a separation structure extending through the one or more BSG layers and further into the substrate, the separation structure further being positioned between the first and second slit structures and extending in the horizontal direction.

19. The semiconductor device according to claim 1, wherein the spacer structure surrounds the portion of the sidewalls of the second dielectric structure.

20. The semiconductor device according to claim 1, wherein the spacer structure does not surround the sidewalls of the second dielectric structure.

* * * * *